US005955877A

United States Patent [19]
Farnworth et al.

[11] Patent Number: 5,955,877
[45] Date of Patent: Sep. 21, 1999

[54] METHOD AND APPARATUS FOR AUTOMATICALLY POSITIONING ELECTRONIC DICE WITHIN COMPONENT PACKAGES

[75] Inventors: Warren M. Farnworth, Nampa; Alan G. Wood, Boise; John O. Jacobson, Boise; David R. Hembree, Boise; James M. Wark, Boise, all of Id.; Jennifer L. Folaron; Robert J. Folaron, both of Plano, Tex.; Jay C. Nelson; Lelan D. Warren, both of Dallas, Tex.

[73] Assignee: Micron Technology, Inc., Boise, Id.

[21] Appl. No.: 09/170,844

[22] Filed: Oct. 13, 1998

Related U.S. Application Data

[60] Division of application No. 08/693,398, Aug. 7, 1996, Pat. No. 5,894,218, which is a continuation-in-part of application No. 08/228,809, Apr. 18, 1994, abandoned.

[51] Int. Cl.$^6$ .................................................. G01R 31/26
[52] U.S. Cl. ..................................... 324/158.1; 324/765
[58] Field of Search .................................. 324/758, 760, 324/765, 158.1

[56] References Cited

U.S. PATENT DOCUMENTS

| | | |
|---|---|---|
| 4,281,449 | 8/1981 | Ports et al. . |
| 4,312,117 | 1/1982 | Robillard et al. . |
| 4,500,836 | 2/1985 | Staudacher . |
| 4,526,646 | 7/1985 | Suzuki et al. . |
| 4,543,659 | 9/1985 | Ozaki . |
| 4,585,991 | 4/1986 | Reid et al. . |
| 4,677,474 | 6/1987 | Sato et al. ........................... 324/758 X |
| 4,736,437 | 4/1988 | Sacks et al. . |
| 4,859,614 | 8/1989 | Sugahara et al. . |
| 4,899,107 | 2/1990 | Corbett et al. . |
| 4,899,921 | 2/1990 | Bendat et al. . |
| 4,924,589 | 5/1990 | Leedy . |
| 4,929,893 | 5/1990 | Sato et al. .............................. 324/758 |
| 4,992,850 | 2/1991 | Corbett et al. . |
| 5,002,895 | 3/1991 | LeParquier et al. . |
| 5,008,614 | 4/1991 | Shreeve et al. . |

(List continued on next page.)

FOREIGN PATENT DOCUMENTS

| | | |
|---|---|---|
| 55-41775 | 3/1980 | Japan . |
| 55-128840 | 10/1980 | Japan . |
| 55-164376 | 12/1980 | Japan . |

OTHER PUBLICATIONS

Larry Gilg, Lo–Soun Su, Mark Louis, "Known Good Die (KGD) Assurance Technologies: United States Competitive Assessment," *Sematech*, Jul. 31, 1995.

"Flip Chip Interconnect Technology, Process and Test Methods for Known Good Die," *ETEC*. (date unavailable).

Advertisement of Schunk Precision Workholding Systems, THK Cross roller table type VRT/VRU. (date unavailable).

Dr. Larry Schmitt, "A Vision of Vision in the Gigabit Era," *Semiconductor Intenational*, pp. 120–124, Jun. 1993.

"Equipment, Processes and Methods for High Volume KGD Production," Third Annual Manufacturing Test Conference, pp. 150–171, Jul. 1994.

Known Good Die Workshop, *Sematech,* Sep. 13 & 14, 1995.

Andrews et al., Consortia for Known Good Die (KGD), Feb. 1994.

Poole, Lon, "Your Computer Revealed: Inside the Processor", *MacWorld,* Oct. 1992, pp. 136–142.

*Primary Examiner*—Glenn W. Brown
*Attorney, Agent, or Firm*—Trask, Britt & Rossa

[57] ABSTRACT

A method and apparatus of assembling and disassembling semiconductor dice to be tested from the components of a temporary test package. A computer-controlled vision system is employed to align the dice with the temporary test package bases, and an automated robot arm system is employed to retrieve and assemble the dice with the various package components. The invention has particular utility in the burn-in and other pre-packaging testing of dice to establish known good dice (KGD).

7 Claims, 17 Drawing Sheets

U.S. PATENT DOCUMENTS

| | | | |
|---|---|---|---|
| 5,008,617 | 4/1991 | Czubatyj et al. . | |
| 5,014,161 | 5/1991 | Lee et al. . | |
| 5,023,189 | 6/1991 | Bartlow . | |
| 5,052,606 | 10/1991 | Cipolla et al. . | |
| 5,059,559 | 10/1991 | Takahashi et al. . | |
| 5,073,117 | 12/1991 | Malhi et al. . | |
| 5,088,190 | 2/1992 | Malhi et al. . | |
| 5,103,557 | 4/1992 | Leedy . | |
| 5,113,565 | 5/1992 | Cipolla et al. . | |
| 5,123,823 | 6/1992 | Banjo et al. . | |
| 5,123,850 | 6/1992 | Elder et al. . | |
| 5,138,434 | 8/1992 | Wood et al. . | |
| 5,145,099 | 9/1992 | Wood et al. . | |
| 5,177,439 | 1/1993 | Liu et al. . | |
| 5,212,647 | 5/1993 | Raney et al. | 364/474.34 |
| 5,212,880 | 5/1993 | Nishiguchi et al. . | |
| 5,238,174 | 8/1993 | Ricketson et al. . | |
| 5,288,698 | 2/1994 | Banjo et al. . | |
| 5,326,428 | 7/1994 | Farnworth et al. . | |
| 5,367,253 | 11/1994 | Wood et al. . | |
| 5,374,888 | 12/1994 | Karasawa . | |
| 5,416,592 | 5/1995 | Mori et al. . | |
| 5,448,165 | 9/1995 | Hodge et al. . | |
| 5,451,165 | 9/1995 | Cearley-Cabbiness et al. . | |
| 5,463,227 | 10/1995 | Stern et al. . | |
| 5,463,325 | 10/1995 | Fujii . | |
| 5,467,517 | 11/1995 | Sugito et al. . | |
| 5,468,157 | 11/1995 | Roebuck et al. . | |
| 5,468,158 | 11/1995 | Roebuck et al. . | |
| 5,471,310 | 11/1995 | Spigarelli et al. . | |
| 5,475,317 | 12/1995 | Smith . | |
| 5,479,105 | 12/1995 | Kim et al. . | |
| 5,481,203 | 1/1996 | Appold . | |
| 5,483,174 | 1/1996 | Hembree et al. . | |
| 5,506,510 | 4/1996 | Blumenau . | |
| 5,506,684 | 4/1996 | Ota et al. . | |
| 5,510,723 | 4/1996 | Canella et al. | 324/758 |
| 5,516,023 | 5/1996 | Kono . | |
| 5,516,026 | 5/1996 | Ariye et al. . | |
| 5,517,125 | 5/1996 | Posedel et al. . | |
| 5,519,332 | 5/1996 | Wood et al. . | |
| 5,523,586 | 6/1996 | Sakurai . | |
| 5,523,696 | 6/1996 | Charlton et al. . | |
| 5,528,157 | 6/1996 | Newberry et al. . | |
| 5,528,159 | 6/1996 | Charlton et al. . | |
| 5,530,376 | 6/1996 | Lim et al. . | |
| 5,534,785 | 7/1996 | Yoshizaki et al. . | |
| 5,534,786 | 7/1996 | Kaneko et al. . | |
| 5,536,974 | 7/1996 | Nishiguchi . | |
| 5,537,051 | 7/1996 | Jalloul et al. . | |
| 5,537,204 | 7/1996 | Woodhouse . | |
| 5,539,324 | 7/1996 | Wood et al. . | |
| 5,541,524 | 7/1996 | Tuckerman et al. . | |
| 5,541,525 | 7/1996 | Wood et al. . | |
| 5,543,725 | 8/1996 | Lim et al. . | |
| 5,568,057 | 10/1996 | Kim et al. . | |
| 5,571,027 | 11/1996 | Roebuck et al. . | |
| 5,574,384 | 11/1996 | Oi . | |
| 5,640,199 | 6/1997 | Garakani et al. . | |
| 5,644,245 | 7/1997 | Saitoh et al. | 324/754 |
| 5,667,129 | 9/1997 | Morita et al. . | |
| 5,794,526 | 8/1998 | Raney | 100/39 |

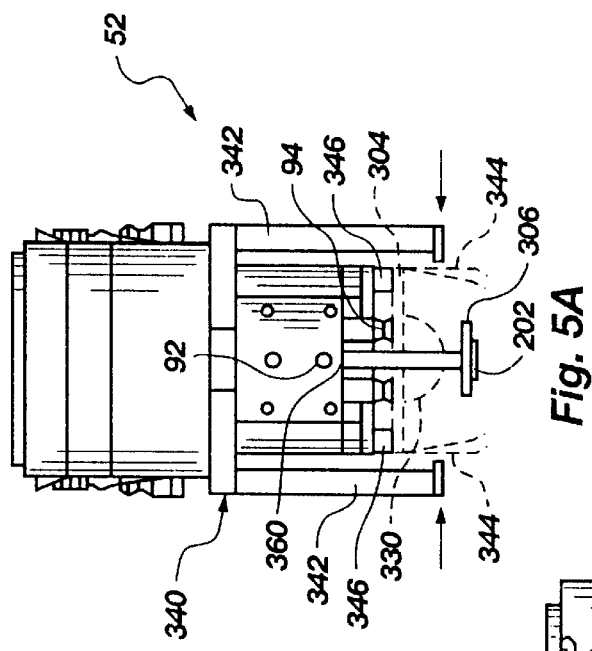
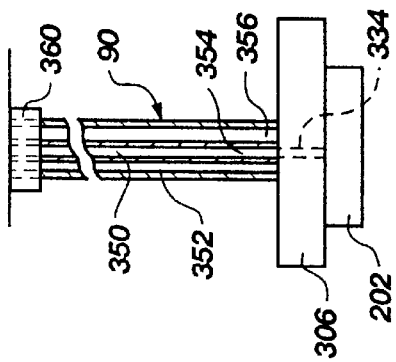
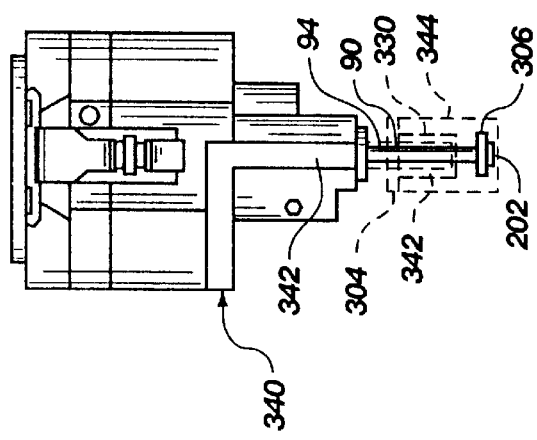
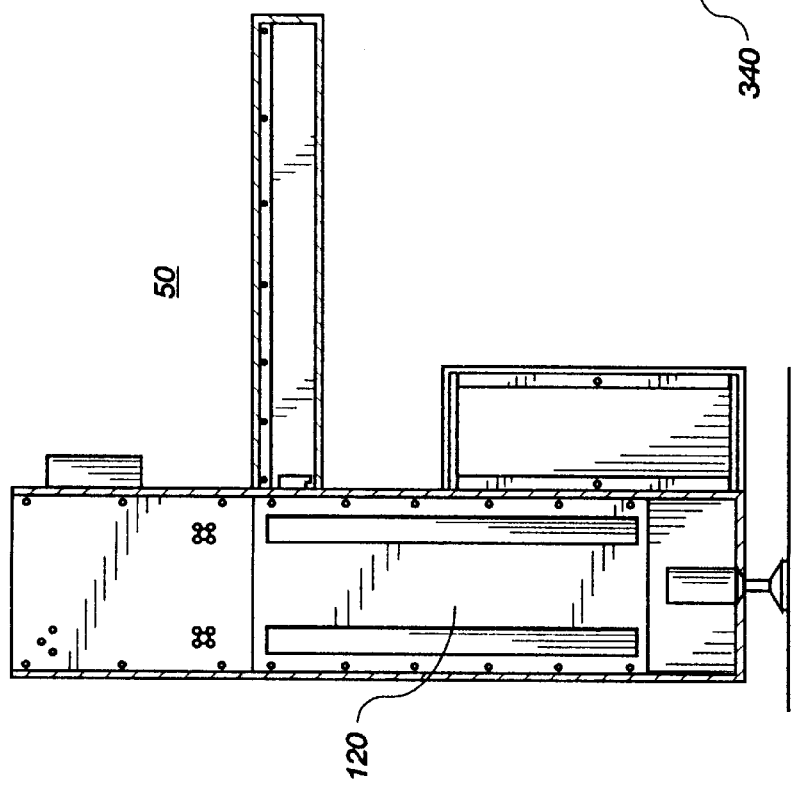

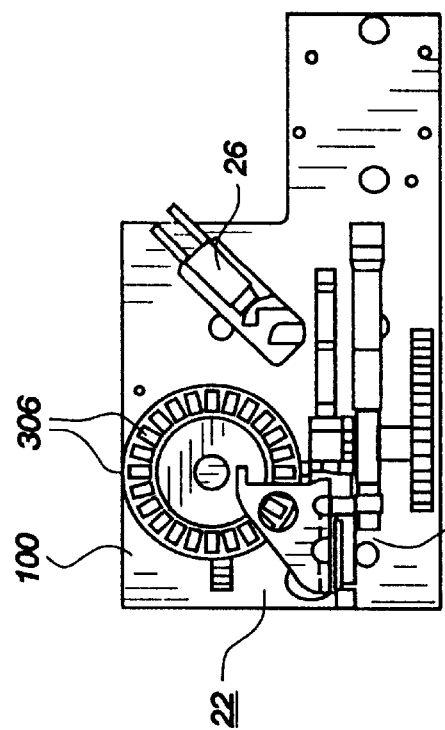
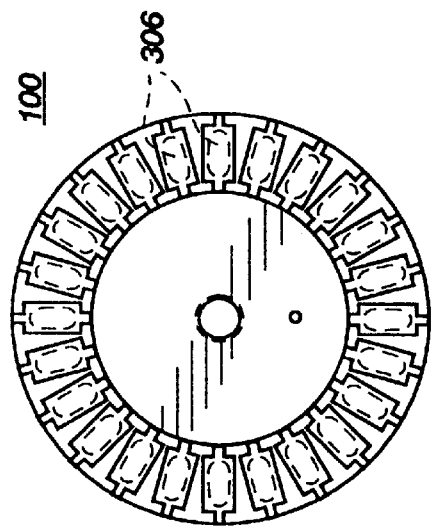
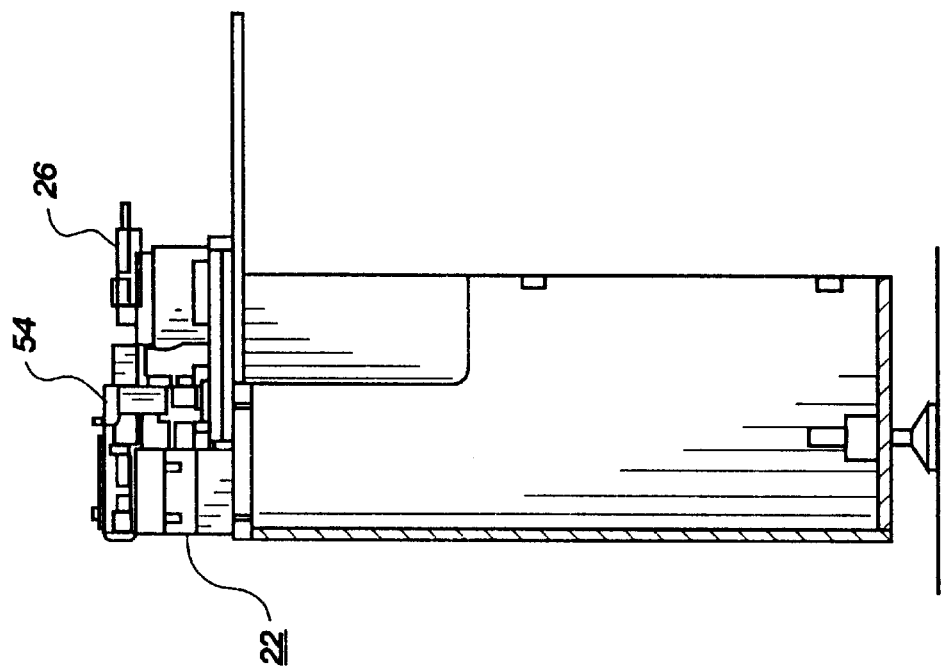
Fig. 7A
Fig. 7C
Fig. 7B

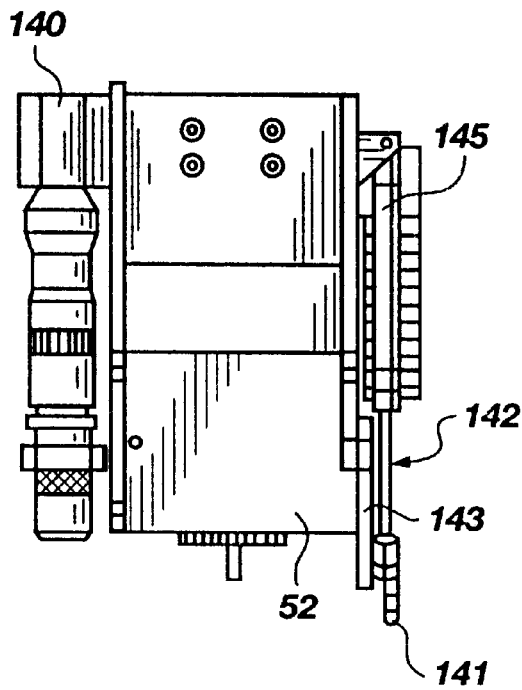
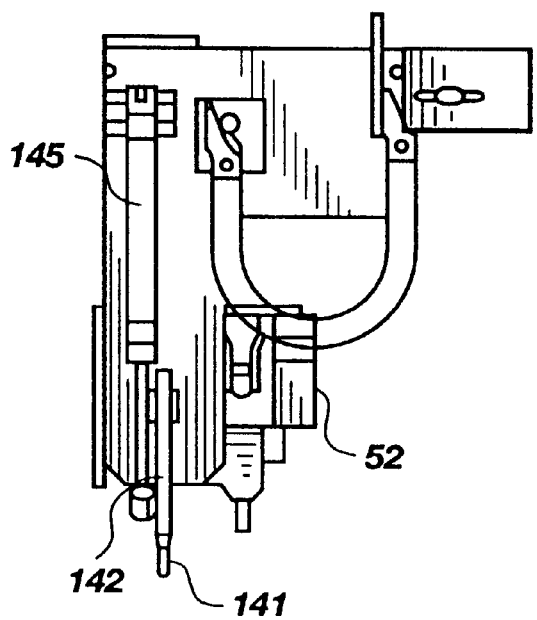
Fig. 11A        Fig. 11B
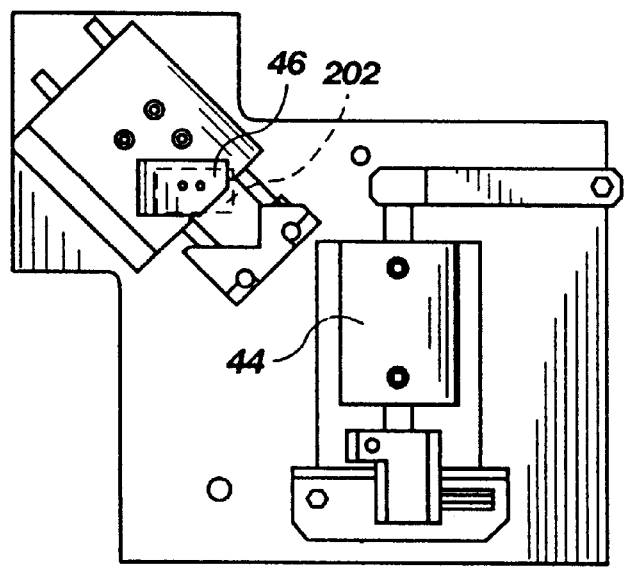
Fig. 13

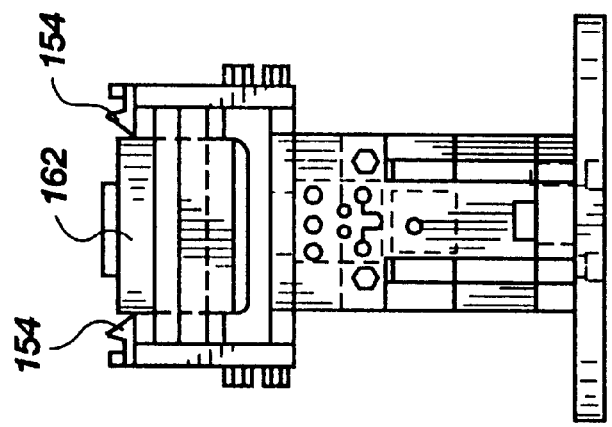
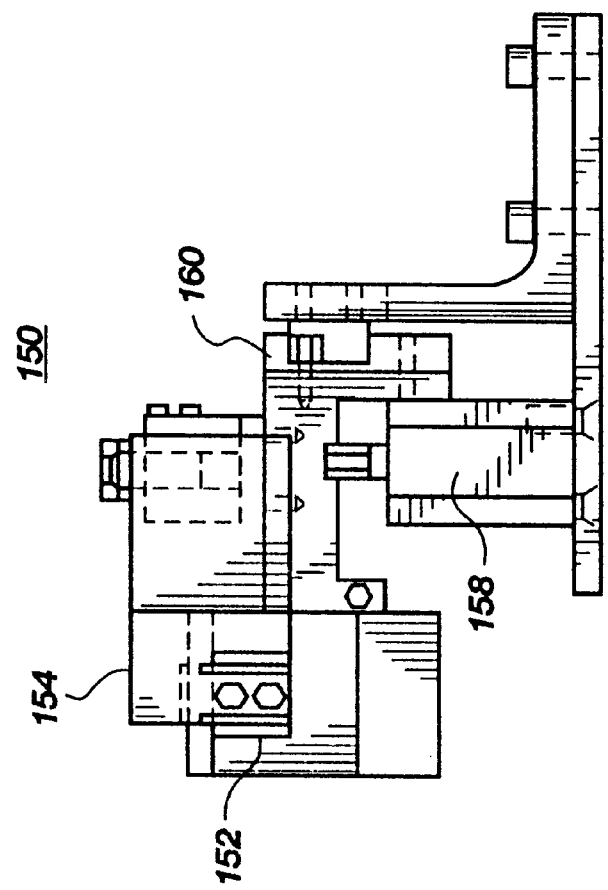
Fig. 12B
Fig. 12A

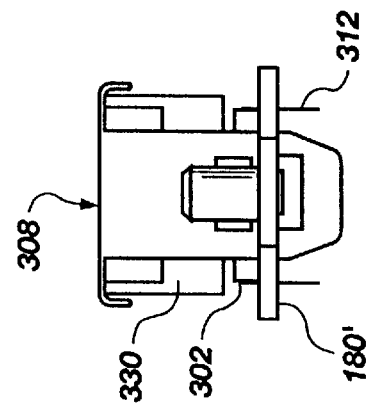
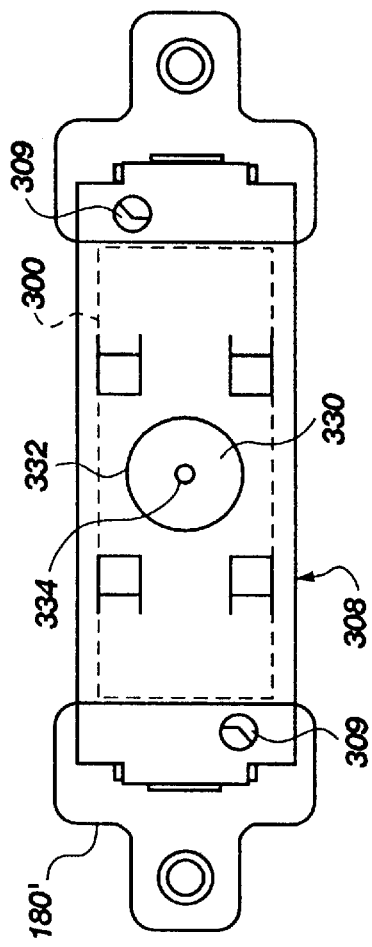
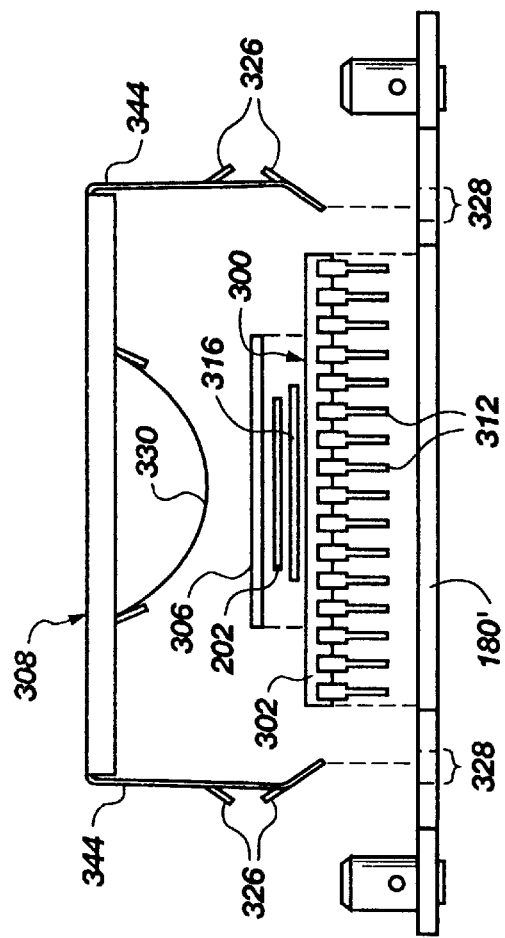

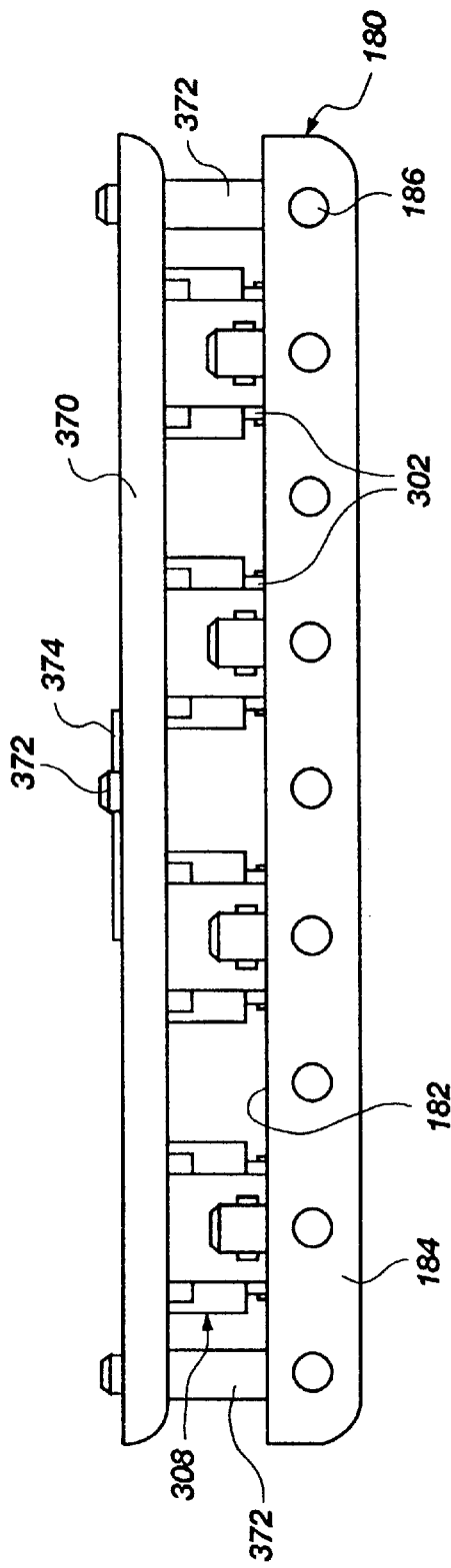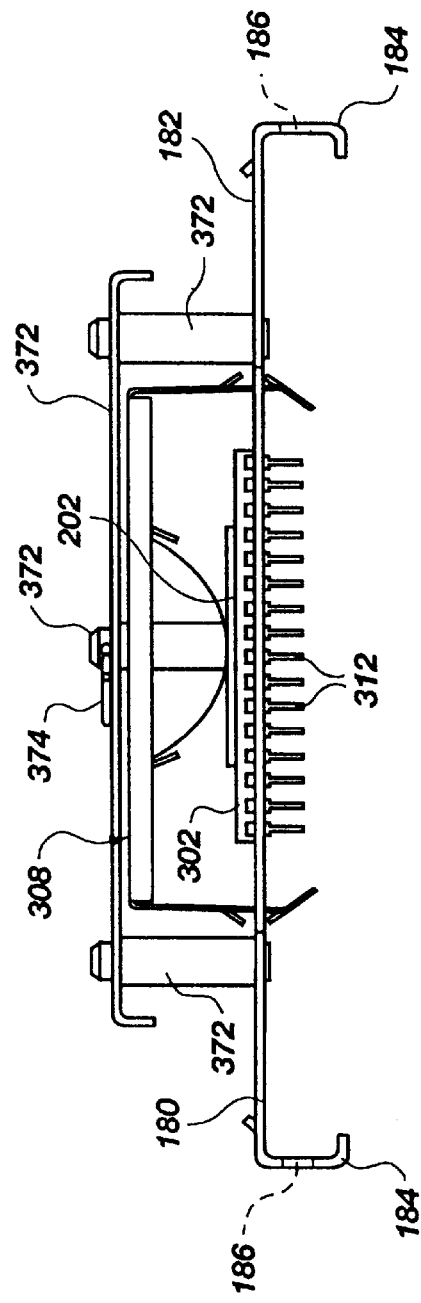
Fig. 16B
Fig. 16C

METHOD AND APPARATUS FOR AUTOMATICALLY POSITIONING ELECTRONIC DICE WITHIN COMPONENT PACKAGES

CROSS REFERENCE TO RELATED APPLICATION

This application is a divisional of application Ser. No. 08/693,398, filed Aug. 7, 1996, now U.S. Pat. No. 5,894,218, which is a continuation-in-part of U.S. patent application Ser. No. 08/228,809, filed Apr. 18, 1994, now abandoned.

BACKGROUND OF THE INVENTION

1. Field of the Invention

The present invention relates generally to computer-aided methods and systems for manufacturing products in a high volume, automated, continuous process and, more particularly, to improved methods and apparatus for automated retrieval, alignment, placement and securement of singulated bare semiconductor dice within preformed packages for testing and burn-in, followed by optional subsequent removal of the dice from the packages.

2. State of the Art

Integrated circuit devices are well-known in the prior art. Such devices, or so-called "dice," may include a large number of active semiconductor components (such as diodes, transistors) in combination with (e.g., in one or more circuits with) various passive components (such as capacitors, resistors), all residing on a "chip" or die of silicon or, less typically, gallium arsenide. The combination of components results in a semiconductor or integrated circuit die which performs one or more specific functions, such as a microprocessor die or a memory die, as exemplified by ROM, PROM, EPROM, EEPROM, DRAM and SRAM.

Such dice are normally designed to be supported or carried in a package having a plurality of externally-accessible pins or leads, to which terminals such as bond pads on the die are electrically connected within the package to access other electronic components employed in combination with the die. A package provides mechanical support and protection for the die, may serve as a heat sink, and is normally square or rectangular in shape. The packages typically comprise a filled polymer compound transfer molded about a die wire-bonded or otherwise electrically connected and physically supported by a lead frame structure, or a two-piece preformed ceramic package to which the die is physically and electrically connected before the package lid is secured. Metal packages are also used, although generally in small quantities and for so-called "military spec" applications.

Packaging defective dice or unknown bad dice (UBD) which are packaged, tested and then scrapped after proven defective in post-packaging testing is inefficient and costly. Accordingly, the bare dice are often tested for continuity during the die fabrication process and before packaging. Such testing may be and has been accomplished by placing bare die in temporary packages having terminals aligned with the terminals (bond pads) of the die to provide electrical access to the devices on the die and subjecting the die via the assembled package to extensive testing, which includes burn-in and discrete testing. Exemplary state-of-the-art fixtures and temporary packages for die testing are disclosed in U.S. Pat. Nos. 5,367,253 and 5,519,332 (to some of the inventors named herein); 5,448,165; 5,475,317; 5,468,157; 5,468,158; 5,483,174; 5,451,165; 5,479,105; 5,088,190; and 5,073,117. U.S. Pat. Nos. 5,367,253 and 5,519,332, assigned to the assignee of the present application, are each hereby incorporated herein for all purposes by this reference.

Discrete testing includes testing the die devices for speed and for errors which may occur after fabrication and after burn-in. Burn-in testing is conducted at elevated potentials and for a prolonged period of time, typically 24 hours, at varying and reduced and elevated temperatures such as −15° C. to 125° C. to accelerate failure mechanisms such that die devices which have the potential to prematurely fail during normal operation can be identified and eliminated. Dice which survive discrete testing and burn-in are termed "known good die," or KGD.

Failure of one die on a multi-chip module (MCM), including a so-called single in-line memory module (SIMM), compromises performance of the entire module or, if identified after assembly but before shipment to the customer, at the least initiates a relatively costly and time-consuming rework process to replace the bad die if the entire MCM is not to be scrapped. Even if individual die yield is relatively high, the combination of such dice in an MCM nonetheless produces an abysmal module yield. For example, if a particular MCM design includes twenty (20) dice with an average "good die" yield rate of 97.3%, the overall yield rate would be predicted to be a dismal 57.3%, which is not commercially viable. Moreover, subjecting the printed circuit or other die carrier of the MCM to burn-in may not be desirable as causing unnecessary stress on elements of the MCM other than the die. Therefore, employing KGD in an MCM is perceived as an optimum way to fabricate high-reliability multi-die products.

However, while desirable, testing bare, unpackaged dice requires a significant amount of handling. The temporary package must not only be compatible with test and burn-in procedures, but must also physically secure and electrically access the die without damaging the die at the bond pads or elsewhere. Similarly, assembly of the die with the package and disassembly after testing must be effected without die damage. The small size of the die itself and minute pitch (spacing) of the bond pads of the die, as well as the fragile nature of the thin bond pads and protective layer covering devices and circuit elements on the active surface of the die, makes a somewhat complex task extremely delicate. Performing these operations at high speeds with requisite accuracy and repeatability has proven beyond the capabilities of the state of the art.

Bond pads are discrete conductive areas on the active face of the die which are used for connecting the internal die circuitry to the conductors of the package. Accurate positioning of the die within the temporary package is therefore critical since alignment of the die bond pads relative to the contacts of the temporary package electrical conductors must be effected in order to subject the die to testing.

Precising die packaging includes mechanically locating a component in a precise position or placement. Various "precising" methods for this purpose are known in the art. However, there have been several problems associated with such precising methods and systems. For example, it has proven difficult to position the die bond pads in electrical contact with temporary package electrical contacts in an accurate and consistent manner so as to facilitate a repeatable, high volume, continuous assembly process of dice within temporary packages. Another disadvantage associated with prior art equipment and processes is that the die is often destroyed or damaged upon contact with the temporary package, lowering product yield and profit margins. Accurate, repeatable positioning placement and securement of the die in the temporary package is thus critical to providing acceptable KGD qualification on a commercial basis.

One attempt to overcome the problems associated with the prior art has been to precise dice and packages by mechanical fixturing. However, assembly tolerances used in mechanical fixturing techniques are often insufficiently fine to prevent improper alignment. Mechanical fixturing also leads to damage of the die or temporary package. While such techniques have proven useful in improving the accuracy and reliability of the die placement, these techniques do not enable dice to be precisely positioned within temporary packages in a manner that allows production efficiencies capable of supporting large volume operations.

Other systems for alignment and, optionally, placement of various bare and packaged dice are also known in the art. See, for example, U.S. Pat. Nos. 4,526,646; 4,543,659; 4,736,437; 5,052,606; 5,059,559; 5,113,565; 5,123,823; 5,145,099; 5,238,174; 5,288,698; 5,463,227; and 5,471,310 for vision-based systems. A commercially available vision-based aligner bonder for flip chip bonding, offered by Research Devices of Piscataway, N.J., has also been modified by the assignee of the present invention for manual alignment of bare dice with the electrical contacts of a temporary package employed in KGD qualification. It is believed that certain aspects of the commercial Research Devices system may be disclosed in U.S. Pat. No. 4,899,921. A description of the modified Research Devices system appears in the aforementioned U.S. Pat. No. 5,519,332, assigned to the assignee of the present invention and incorporated herein for all purposes by this reference. A discussion of vision systems' potential applications in the semiconductor industry and associated problems appears in "A Vision of Vision in the Gigabit Era," SEMICONDUCTOR INTERNATIONAL, June 1993, pp. 120–122, 124.

While the foregoing mechanical and visual alignment systems, with ancillary mechanisms for die handling, have achieved some success in their intended applications, to the inventors' knowledge there exists no fully-automated bare die and package assembly and disassembly system capable of accurate and repeatable operation at a speed making KGD qualification or characterization commercially viable for use as a matter of course in the die fabrication process.

Accordingly, there remains a long-felt need in the semiconductor industry to provide for improved methods and apparatus for assembling dice to be tested with temporary packages (and subsequently disassembling the dice from the packages) in a high volume, cost-efficient and reliable manner. Toward that end, it is essential that the semiconductor or integrated circuit die be positioned and secured within the temporary packages in an automated manner such that die bond pads are aligned with and suitably biased toward temporary package electrical contacts without physical damage to the die structure.

BRIEF SUMMARY OF THE INVENTION

The present invention provides computer-controlled methods and apparatus for automating the positioning of integrated circuit devices or dice within temporary packages utilizing a high volume, continuous process.

Toward that end, the invention provides an automated apparatus for the positioning of bare electronic dice within temporary packages that is used in-line with other machines to facilitate formation of assembled packages which may then be subjected to continuity testing, burn-in and the like.

The invention further includes methods and systems for accurately positioning electronic dice within temporary packages in a reliable, cost-effective manner. Accordingly, the invention provides methods and apparatus for continuous positioning of integrated circuit dice within temporary packages in an automated production sequence while significantly reducing the percentage of dice and temporary package assemblies in which electrical continuity is not established. In so doing, the invention employs multiple inspections of the dice and temporary package prior to, during and after placement of the dice within the temporary package. By inspecting the dice at various stages of assembly, dice which are not properly aligned or positioned can be repositioned to ensure electrical continuity between all of the die bond pads and the contacts of the temporary package electrical conductors. The aforementioned inspections are preferably effected by multiple cameras to facilitate precise placement of the die in the temporary packages in a continuous manner to significantly enhance the efficiency of the assembly process and increase the number of packages in which electrical continuity is established.

In yet another aspect, the invention provides an apparatus for placing dice in temporary packages wherein the packages are supported on carriers (also termed boats or trays) that are conveyed along a path through a predetermined package assembly/disassembly position. A carrier preferably includes a body portion and at least one side rail having a plurality of spaced indexing openings therein. The carrier may be formed of plastic or metal. The conveyor portion of the apparatus further includes an indexing mechanism that functions in conjunction with the indexing openings to place each temporary package in the predetermined assembly/disassembly position to allow the integrated circuit die to be positioned precisely therein.

The invention utilizes previously stored dimensional and visual characteristics for a die as well as similar characteristics of a known temporary package and a known boat or tray to assemble and disassemble electrical dice and temporary packages respectively to and from one another based on predetermined parameters, and to classify the die appropriately.

According to more specific aspects of the present invention, an assembly system is provided to place die bond pads in electrical communication with electrical contacts of temporary package conductors. Once the die bond pads are placed in secure communication with the package contacts, the temporary package can be placed in a standard device tester and subjected to extensive testing. Such testing includes burn-in testing and the like to establish various die characteristics and eliminate mortality in subsequent use of the die. These characteristics, while not meant to be limiting, include the quality of the electrical contact between the die and the temporary package conductors, as well as speed grade characteristics by which the die itself may be classified.

The present invention includes a system which picks up and places a face-up die on a die inverter. The die is then inverted by the inverter and placed in the view field of a rough die camera, which takes a picture of the die. Using positional feedback from the rough die picture, a robot having a primary gripper and also carrying a die restraining device (which may comprise a single or multi-component device) thereon retrieves the die from the inverter. The die is then presented to a fine die camera by the robot and multiple pictures of the die are taken to enhance resolution.

While the die is being located by the die cameras, a carrier (also termed a boat or tray, as previously noted) containing a plurality of temporary package bases is simultaneously indexed to place a temporary package base located in the carrier in a predetermined assembly/disassembly position along a conveyor. An electrical socket below the temporary package receives the leads of the temporary package base from below for electrical continuity testing. A rough temporary package picture is then taken of the temporary package base and used to determine a rough location of the temporary package base at the assembly/disassembly position. In a preferred embodiment, a laser height sensor may be used to determine the height of the temporary package base at the assembly/disassembly position prior to taking fine package vision pictures, in order to keep the camera in focus. A fine temporary package camera is then positioned over selected electrical contacts of the temporary package base at the assembly/disassembly position and multiple fine temporary package pictures are also taken to enhance resolution.

The die and die restraining device are then transferred by a primary gripper to the predetermined assembly/disassembly position. The robot aligns the die and temporary package base using the fine temporary package and fine die pictures, and presses the die, die restraining device superimposed on the die, and package together to form an assembled test package which is then tested for continuity using the aforementioned test socket.

During the assembly process, the robot preferably drives the primary gripper carrying the die with the superimposed restraining device downwardly over the package base to a minimum programmed package assembly interlocking height and tests the completed assembly for continuity. If continuity is confirmed, the robot then releases the die restraining device and die. If continuity is not established, the robot increments downward to a maximum programmed force setting. If continuity is still not established, the restraining device and die are removed from the package base. A new package base is placed in the predetermined assembly position and the fine die, rough package, and fine package pictures are retaken. The die with its associated restraining device and the new temporary package base are then assembled and tested.

In an alternative embodiment of the present invention, the robot drives the primary gripper down until physical contact is established between the die and the temporary package. After physical contact is established, the robot drives to a minimum programmed assembly interlocking height. The primary gripper then releases the die and associated lid with the spring and clip of the restraining device and retracts to a waiting position. Electrical continuity of the assembly is tested. If the assembly has electrical continuity between the die and the temporary package base, the process is completed. If electrical continuity is not established, the primary gripper retrieves the die and restraining device and awaits instruction from the operator. The operator may choose to retry assembly of the present temporary package, utilize the next available package base, or purge the die from the system and use the next die.

Any electromechanical device which is capable of transferring component parts from one position to another may be used in the present invention. In a preferred embodiment, however, the transferring device is a robot arm. The apparatus has a control mechanism, including a microprocessor and associated program routines, that selectively controls the robot arm (i) to move the primary gripper to pick up a restraining device and (if lid and other elements of the restraining device such as a spring/clip combination are separate components) to a lid feeder station to pick up a lid, (ii) to move the primary gripper along with the restraining device to pick up the die following photographing by the rough die camera, (iii) to move the primary gripper along with the restraining device and the die to a position to be photographed by the fine die camera, and (iv) to move the restraining device and the die to the predetermined assembly/disassembly position located along the conveyor.

The control routines also function to return the primary gripper to the predetermined assembly position and retrieve the die and restraining device in the event that continuity is not established with the temporary package base. The primary gripper then returns to select a second lid, another restraining device spring/clip element (if separate) and a second die while the carrier is simultaneously indexed to place the next temporary package base of the carrier in the predetermined assembly/disassembly position along the path. The package assembly process continues in this manner.

The present invention, as previously noted, also includes a method and apparatus for disassembling the electrical die and temporary package based on predetermined parameters or characteristics. The disassembly process occurs in a manner substantially opposite the assembly process. In particular, a carrier boat or tray containing a plurality of assembled temporary packages containing dice approaches the predetermined assembly/disassembly position. Each package contains a semiconductor die which has been subjected to extensive testing. The primary gripper retrieves the electrical die and restraining device and places it on a die inverter which inverts the face-down die retrieved from the package base to a face-up position. The die is then placed in an appropriate location for further handling, depending upon whether the burn-in and other testing have proven it to be a KGD or a bad die and, if a KGD, of what classification. The lid of the restraining device is released by the primary gripper and a lid precisor similar to the one used for assembly is used to place the lid in a known location.

The foregoing discussion has merely highlighted some of the more pertinent advantages of the present invention. Such advantages should be construed to be merely illustrative of some of the more prominent features and applications of the invention. Many other beneficial results can be attained by applying the disclosed invention in a different manner or modifying the invention as will be described. Accordingly, other advantages and a fuller understanding of the invention may be had by referring to the following detailed description of the preferred embodiments.

BRIEF DESCRIPTION OF THE SEVERAL VIEWS OF THE DRAWINGS

For a more complete understanding of the present invention and the advantages thereof, reference should be made to the following detailed description taken in connection with the accompanying drawings in which:

FIGS. 5A–5B are front and side views of a primary gripper of a robot arm;

FIG. 5C is an enlarged cross-sectional side view of a vacuum quill carried by the primary gripper;

FIG. 6 illustrates a clip tray feeder for use in the present invention;

FIGS. 7A–7B illustrate plan and side views, respectively, of a lid feeder station suitable for use in accordance with the present invention;

FIG. 7C is an enlarged view of the lid carousel illustrated in FIG. 7A;

FIGS. 11A–11B illustrate side views of a fine temporary package camera and secondary gripper which are suitable for use in accordance with the present invention;

FIGS. 12A–12B show an unclipping mechanism in a lowered position which is suitable for use in the disassembly process of the present invention;

FIG. 13 illustrates a secondary inverter and die precisor for use in the disassembly process of the present invention;

FIGS. 14A, 14B and 14C illustrate plan, side and end views of a preferred test or temporary package employed with the invention;

FIGS. 16A, 16B and 16C, respectively, illustrate a top view of a carrier tray with temporary package bases in place, a side view of a carrier tray with assembled packages, and an end view of a carrier tray with assembled packages.

Similar reference characters refer to similar parts throughout the several views of the drawings.

DETAILED DESCRIPTION OF THE INVENTION

The inventive method and apparatus will now be described in conjunction with the continuous positioning of integrated circuit (semiconductor) dice within temporary packages. It should be appreciated that the use of the invention for this purpose should be considered merely exemplary and that the techniques and mechanisms described herein can be used whenever it is desired to accurately position, bond or attach dice.

Figure 1A:
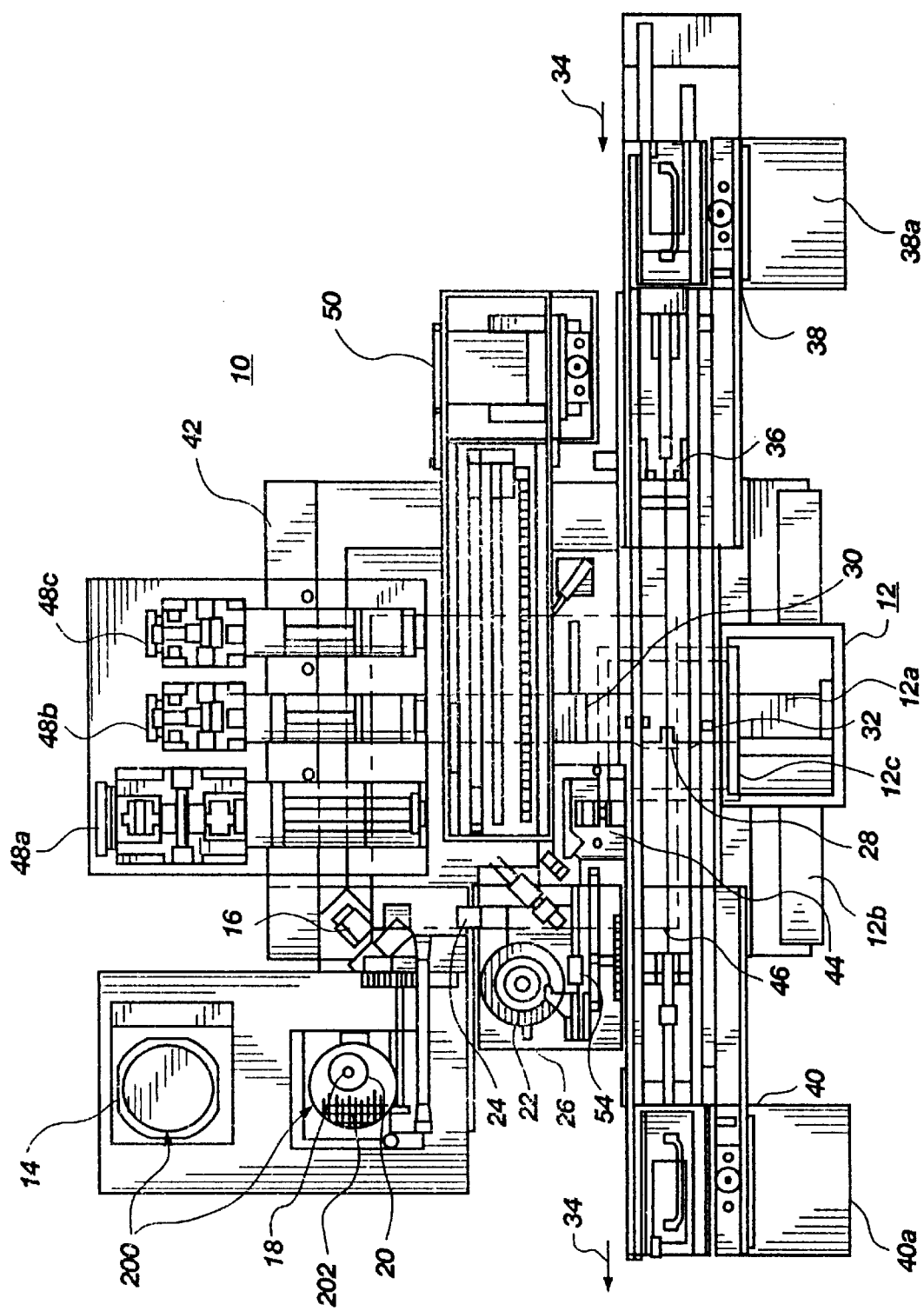
FIG. 1A is a plan view of an assembly/disassembly system for automatically positioning dice within temporary packages in accordance with the present invention.
Figure 16A:
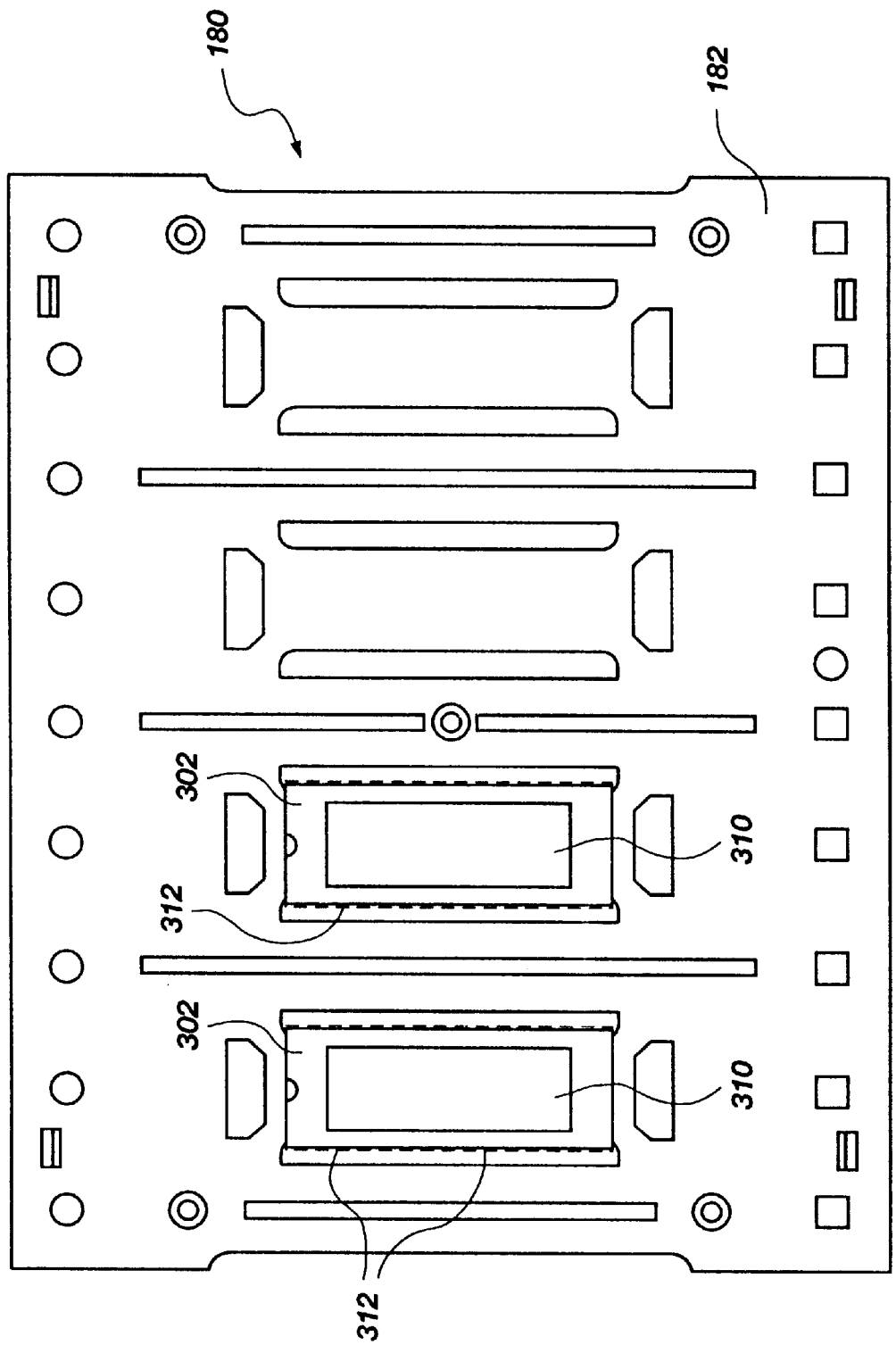

In an exemplary embodiment, a method and apparatus are provided for automatically positioning bare die 202 within temporary packages 300 (FIGS. 14A–C) to facilitate extensive testing. As shown in FIG. 1A, the apparatus 10 generally includes platen or support surface 42, a programmable robot arm system 12, which preferably includes three arms 12a, 12b and 12c, a wafer feeder station 14, die inverter 16, rough die camera 24, a lid feeder station 22, lid precisor 26, fine die camera 30, a predetermined assembly/disassembly position 28, a clip tray feeder 50, and rough and fine temporary package cameras (not shown in FIG. 1A). The assembly/disassembly position 28 is located along a conveyor 36 that conveys a package carrier 180 (FIG. 16A) along a linear path indicated by arrow 34 between a first position, corresponding to inlet 38, and a second position, corresponding to outlet 40. The die and restraining device and base of the temporary package are assembled at assembly/disassembly position 28 as will be described more fully herein.

It should be appreciated that each carrier 180 enters the apparatus at the inlet 38 and then travels along the path through the assembly/disassembly position 28 where the dice are positioned within the package bases 302 (FIG. 16A) in the carrier 180. The continuity between the die 202 and temporary package conductors is preferably evaluated at assembly/disassembly position 28. Thereafter, the carrier 180 with temporary packages 300 containing bare die 202 to be characterized is conveyed through the outlet 40 and the die 202 is then subjected to additional testing as previously mentioned.

Although not shown in detail in FIG. 1A, it is desired that a plurality of carriers 180, each supporting a number of temporary package bases 302 (see FIG. 16A), be continuously supplied to conveyor 36. While not meant to be limiting, this can be accomplished by the use of a carrier input elevator 38a and carrier output elevator 40a. A new carrier 180 is supplied at the inlet 38 after all package bases 302 in a previous boat located at the assembly/disassembly position 28 have been indexed through predetermined position 28. Die 202 and restraining devices 304 (FIG. 5A), such as lids and/or clips, are then supplied to the package bases 302 contained in the new carrier 180. Appropriate sensor and indexing assemblies are located at the inlet 38 and outlet 40 of the conveyor 36 to control the movement of carriers 180 thereon, supply of carriers 180 thereto and removal therefrom.

Conveyors, such as those manufactured by Flexible Technology located in Richardson, Tex., are suitable for use in the present invention. Other conveyors, such as flat belt conveyors, timing belt conveyors, walking beam mechanisms and the like are also suitable for use in the present invention. The conveyor is controlled by a suitable electric motor and gearing mechanism, as is well-known in the art.

As described generally above, a plurality of cameras is used in accordance with the present invention to ensure precise placement of dice within temporary packages. While not meant to be limiting, one embodiment of the present invention utilizes five cameras or image producers. As will become apparent, a first camera is used to accurately locate the initial position of a wafer and individual die before the die is moved. Two additional cameras (rough and fine) are used to locate the die and the remaining two cameras (rough and fine) are used to locate the temporary package base in order to assemble a device under test (hereinafter "DUT"). The present invention uses rough cameras to locate the die's and package base's general positions such that the die and base can each be positioned in the respective fine cameras' fields of view. Preferably, the fine cameras have fields of view in the range of about 0.0020". In an alternative embodiment, three cameras are utilized, namely, a first camera to accurately locate the position of a wafer and individual die thereof, a die camera and a temporary package camera.

Figure 1B:
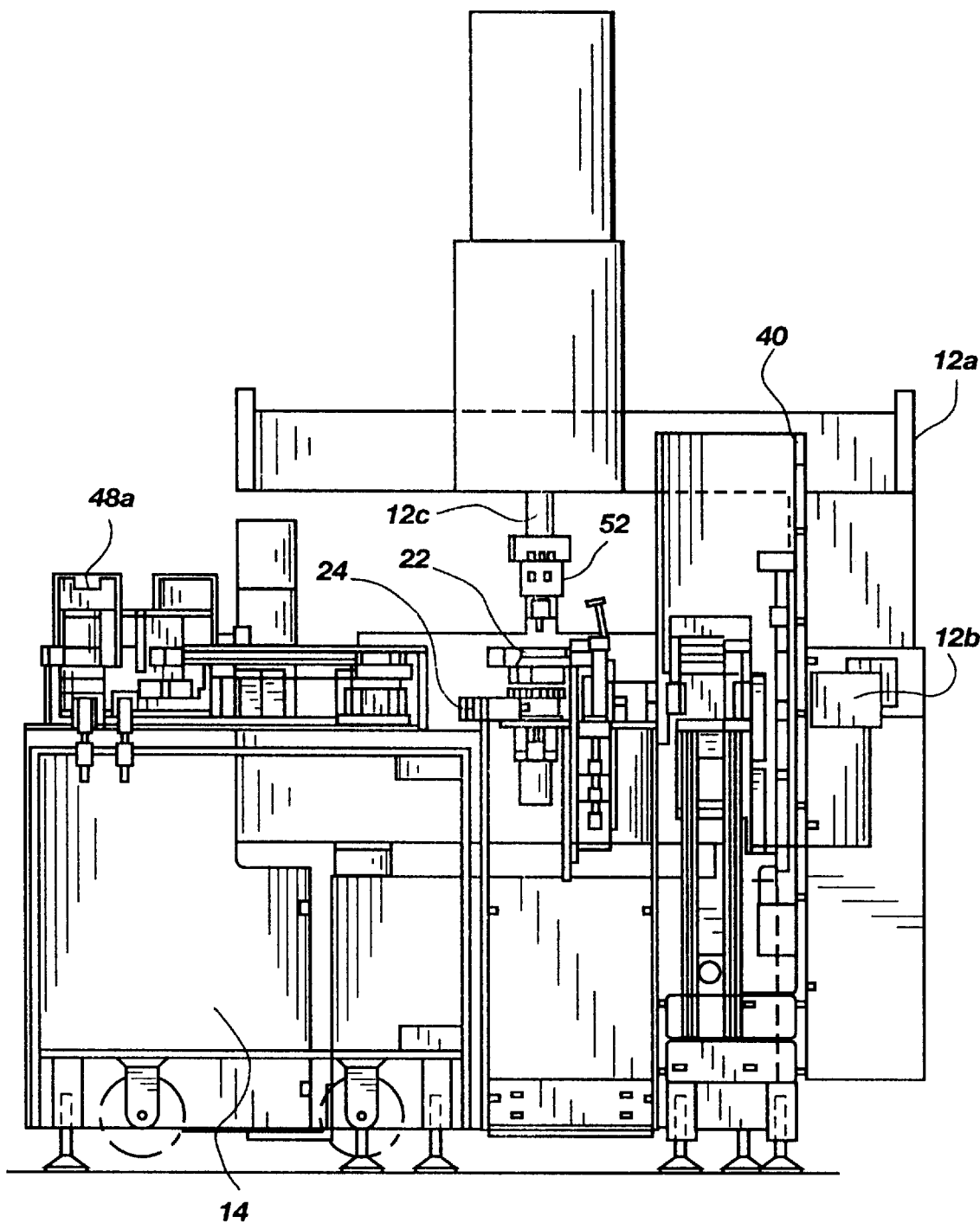
FIGS. 1B–1C are side views of the assembly/disassembly system shown in FIG. 1A.
Figure 1C:
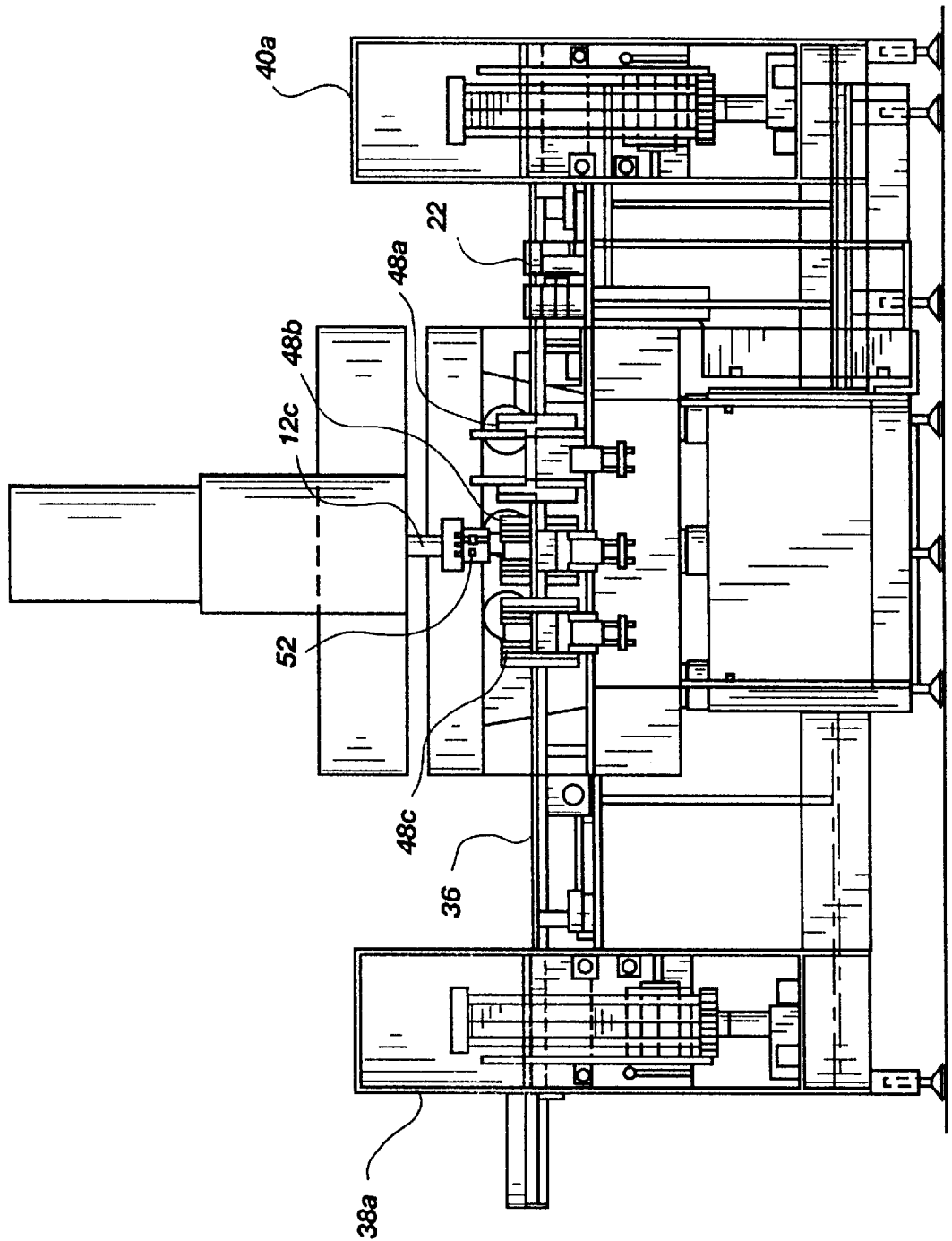

The basic operating method of the automatic die placement apparatus will now be described. FIGS. 1A–1C show an assembly system 10 for automatically positioning dice within temporary packages in accordance with the present invention. Wafers 200, which have been previously tested to select dice from a wafer map or ink dot, are positioned in wafer feeder station 14. The wafers 200 may have previously been divided into individual dice 202. Alternatively, singulated (individualized) dice 202 may be supplied by die pack feeders 48a–48c.

Figure 2A:
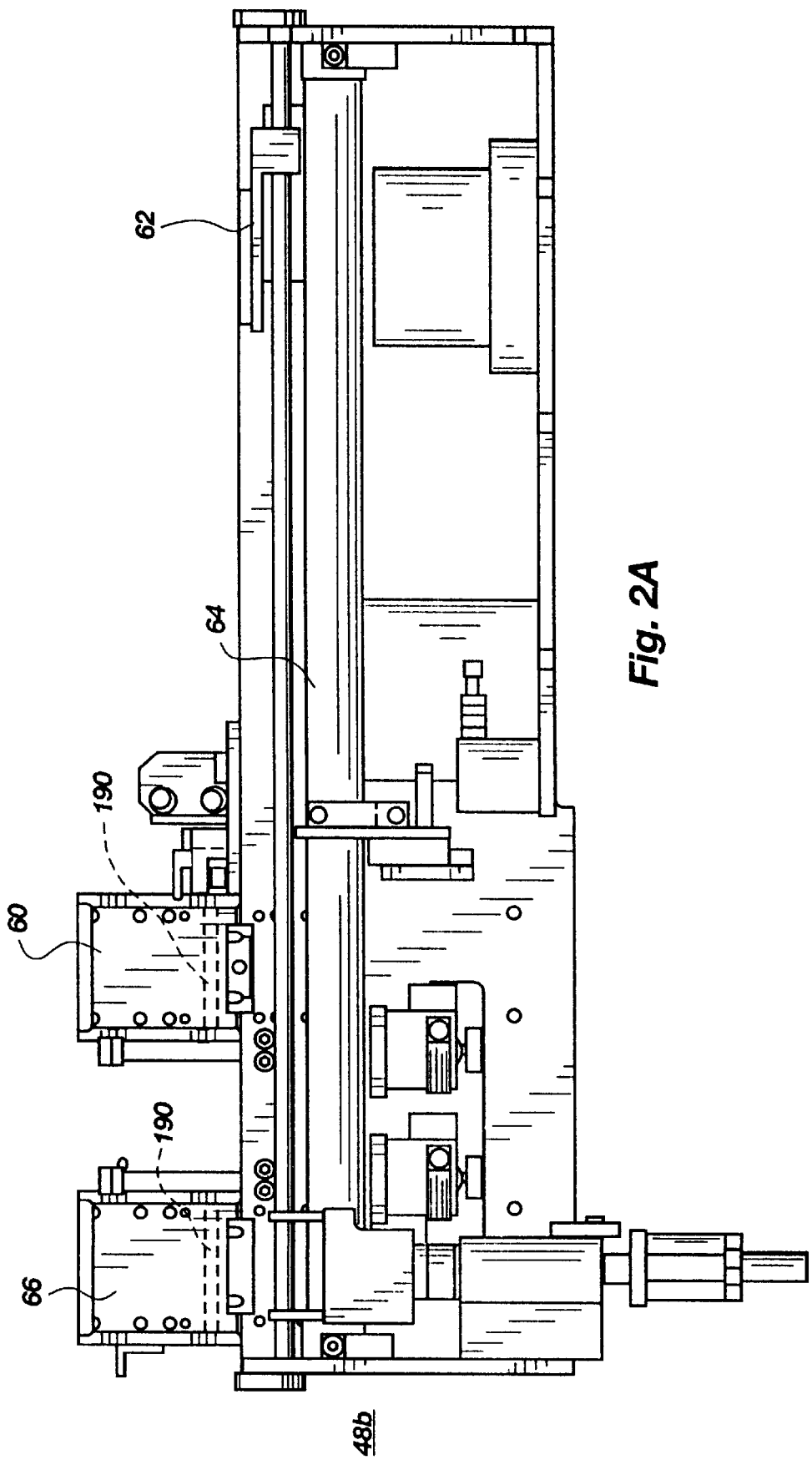
FIGS. 2A–2B are side and plan views, respectively, of a die pack feeder for use in accordance with the present invention.
Figure 2B:
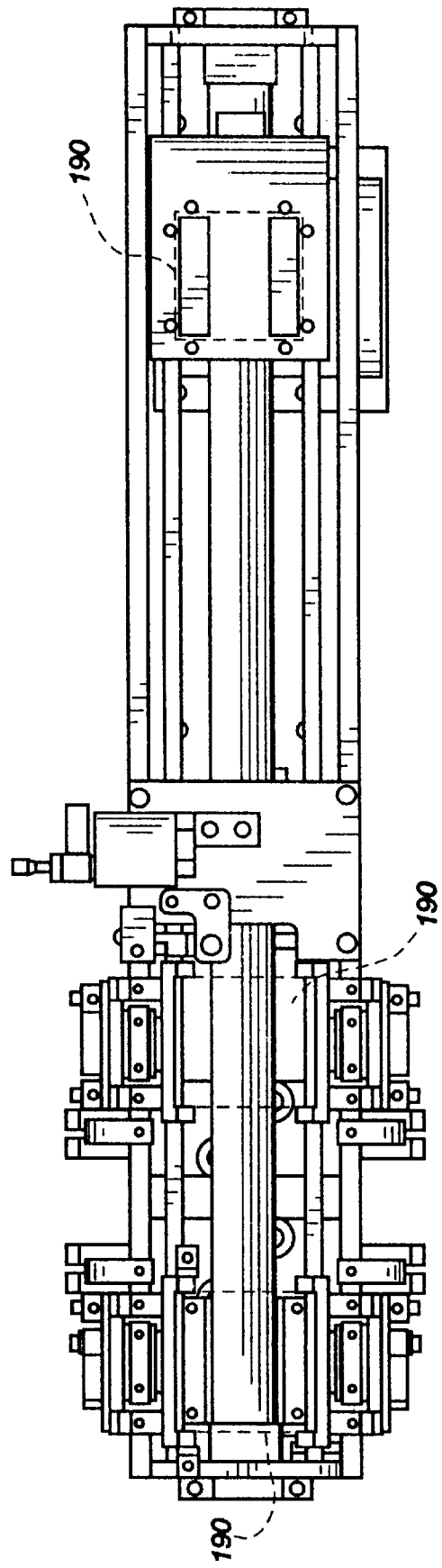

FIGS. 2A–2B illustrate side views of a 2×2" die pack feeder 48b. The die pack feeder 48b includes die pack input 60 and output 66, die shuttle 62 and pneumatic cylinder 64. Alternatively, a 4×4" die pack feeder may be used or, as shown in FIG. 1A, a 2×2" die pack feeder 48b and a 4×4" die pack feeder 48a may both be utilized. Die pack feeders 48b are particularly suitable for use in the invention when singulated dice are supplied to apparatus 10. Die packs 190 (also known as "gel packs") are placed into input 60 and one pack 190 is then moved on shuttle 62 by pneumatic cylinder 64 into the workcell area. Dice 202 are then placed into or taken out of the die packs 190. When the loading or unloading process is completed, shuttle 62 carrying the die pack 190 is moved by pneumatic cylinder 64 to output station 66, where it is removed and shuttle 62 returns to input station 60 to receive another die pack 190.

Figure 3B:
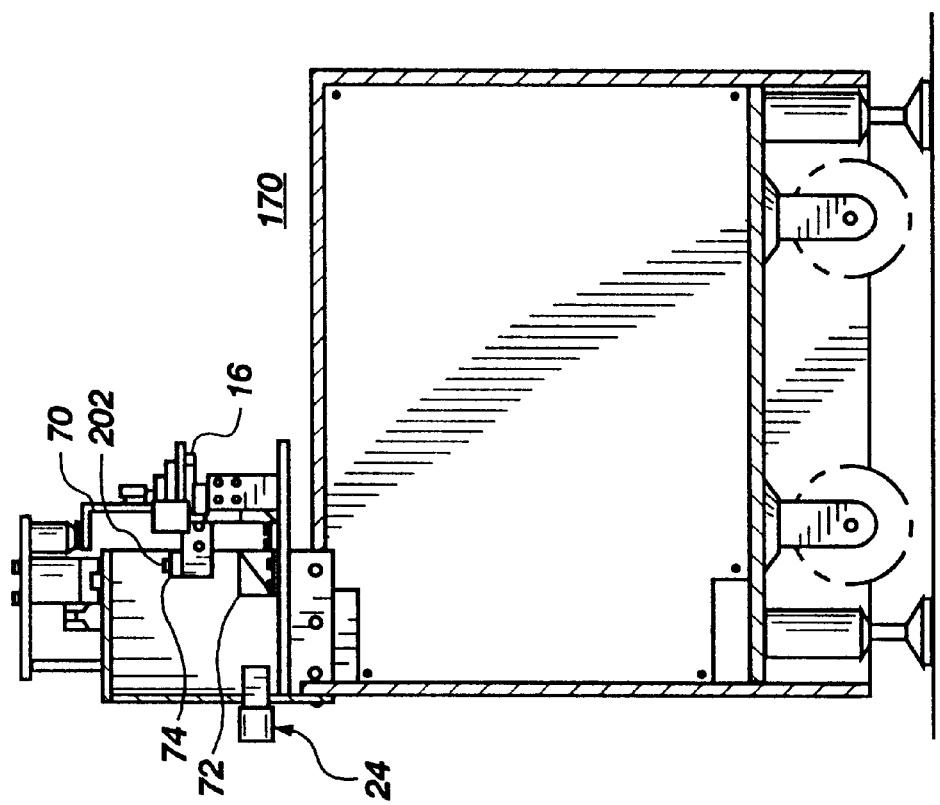
FIGS. 3A–3C are side views of a wafer handler base having a transfer mechanism which is suitable for use in the present invention.
Figure 3A:
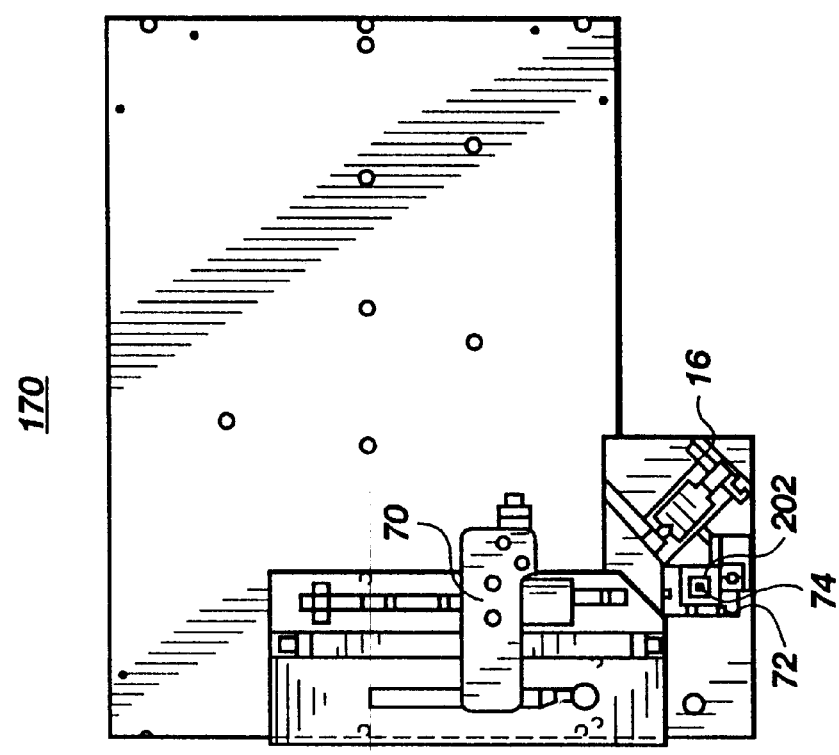
Figure 3C:
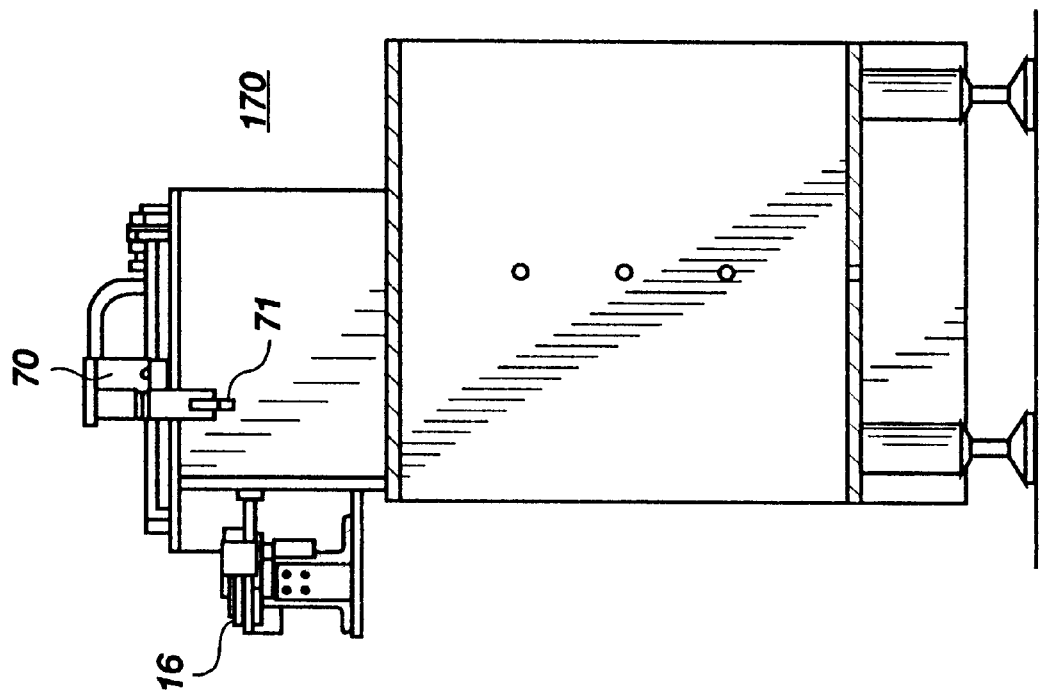

Alternatively, a wafer handler base 170, as illustrated in FIGS. 3A–3C, may be used when the dice are supplied in wafer form 200 (FIG. 1A). First camera 20, as shown in FIG. 1A, is preferably positioned over location 18. Location 18 corresponds to a die transfer position. First camera 20 is preferably located to look down at the film frame and superimposed wafer 200. First camera 20 first determines the exact position of the wafer 200 on the film frame by looking for combi marks or fiducial marks on the wafer. The camera 20 then takes a picture of each die of the wafer 200 to verify that the die is there, to verify that there is no ink dot on the die, and to locate the die's exact position to account for any change in position when the film frame is stretched to slightly laterally separate the die for retrieval.

Die transfer arm 70, shown in FIGS. 3A–3C, of the present invention picks up a die 202 from wafer 200 at location 18 and places the die 202 on die inverter 16. The die is then inverted by die inverter 16, placed on die pedestal 74 and brought into view of rough die camera 24. While not meant to be limiting, die 202 is picked off of wafer handler base 170 or die pack feeder 48b using a vacuum quill 71 (see FIG. 3C) translated by pneumatic cylinders. The cylinders are reciprocated in such a manner that the die is transported and placed on die inverter 16.

Figure 4:
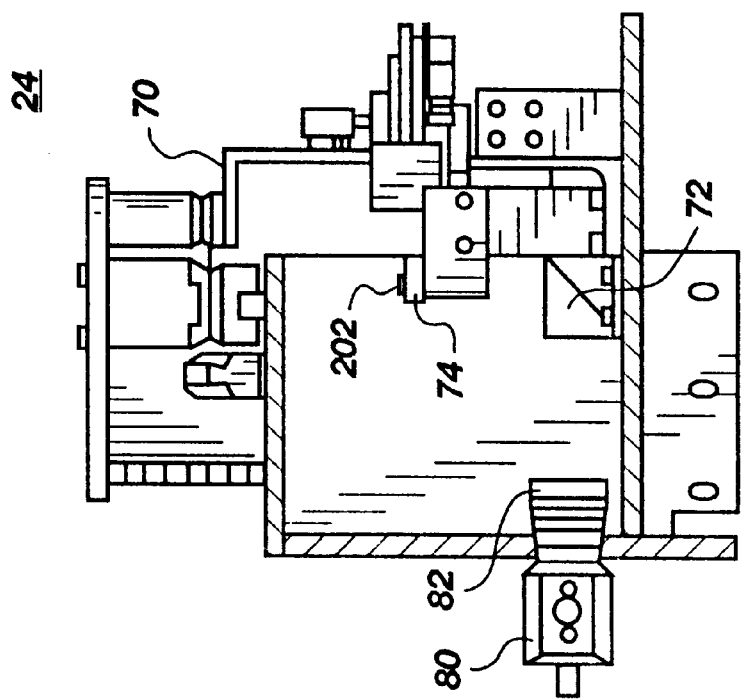
FIG. 4 is a side view of a rough die camera which may be used in the present invention.

Rough die camera 24 is preferably located on base 42 behind lid feeder station 22 (see FIG. 1A). As shown in FIG. 4, rough die camera 24 includes a CCD (Charge Coupled Device) camera 80, lens 82 and prism 72. CCD camera 80, which is preferably located behind lid feeder station 22, looks up at the die 202 through prism 72 and pedestal 74 to determine the general position or location of the die 202 so that robot arm system 12 using primary gripper 52 may retrieve and place the die 202 within the field of view of fine die camera 30. Prior to rough die camera 24 taking a picture, the die 202 is preferably illuminated with backlighting. Rough die camera 24 then takes a picture of the die at pedestal 74.

The rough die picture is analyzed utilizing a computer program to determine the rough position of the die. A blob finder is used to locate the centroid of the die, which is held on the pedestal 74. The blob finder analyzes the binary (black/white) picture of the die and pedestal. Based on the position of the centroid, an edge finding ruler is utilized in the negative Y direction (away from the pedestal) in order to locate the bottom edge of the die, as referenced in the vision window. A line finding box is then used at the bottom edge of the die to locate the angle of the bottom die edge.

The size of the die being manipulated is preferably known and stored in the data file in binary form (IGES format in particular, although other text file formats may be employed) associated with that die. An edge finding ruler is utilized in the negative X direction relative to the vision window. The edge finding ruler starts in the centroid of the die and is used to locate an edge of the die perpendicular to the edge located above. A line finding box is used at the perpendicular edge to locate the angle of the side edge. Once the angle and location of two perpendicular sides of the die is determined, two edge finding rulers are placed over the image. One ruler is placed across the die in order to measure the width of the die. The second ruler is placed perpendicular to the first ruler to find the length of the die to determine the exact size of the die. The center position of the die is calculated, using the average of the angles obtained above.

Using positional feedback data from the computer and rough die picture, robot arm system 12 then orients primary gripper 52 to the die. As shown in FIGS. 5A–5B, primary gripper 52 preferably includes vacuum quill 90, linear slide 92 and suction cups 94. Primary gripper 52, which has a restraining device 304 attached thereto, retrieves the die. While not meant to be limiting, the restraining device may be a bridge clip, a clip and lid, screw or combination thereof. When lids 306 are used with bridge clips 308 as the restraining device (see FIG. 14A), lid transfer arm 54, shown in FIGS. 7A–7B, selects a lid 306 from lid feeder station 22 and presents the lid 306 to mechanical lid precisor 26. Lid precisor 26 is used to place lids 306 in a known location.

In a preferred embodiment, lid feeder station 22 supports a plurality of lids 306 in multiple vertical stacks on a rotatable carousel 100, shown in FIG. 7A. As the lids 306 are exhausted from each stack in the carousel, the carousel 100 rotates to present a new stack to the lid transfer arm 54. When all stacks of the carousel 100 are exhausted, the carousel 100 may be rotated away from the lid transfer arm 54 and a new carousel 100 provided by the operator.

FIGS. 7A–7B illustrate lid feeder station 22, while FIG. 7C depicts a plan view of a lid carousel 100 for use in the present invention.

Figure 8A:
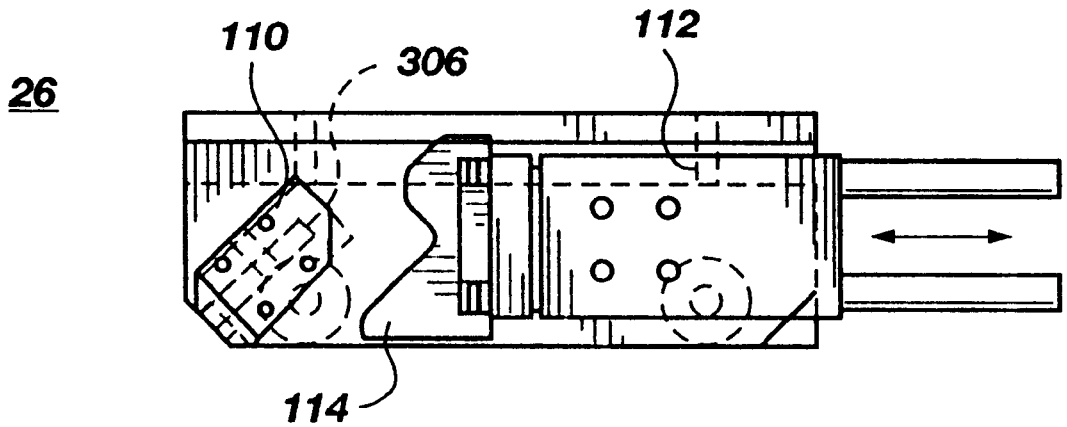
FIGS. 8A–8B are plan and side views, respectively, of a lid precisor which is suitable for use in accordance with the present invention.
Figure 8B:
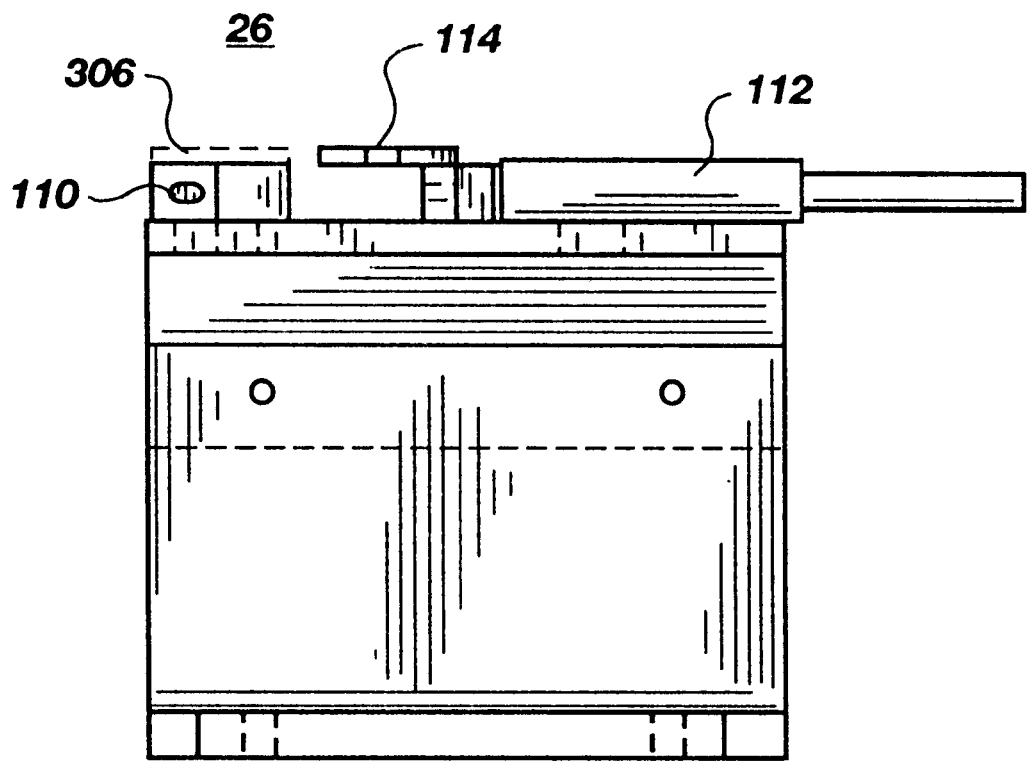

As mentioned above, lid transfer arm 54 selects a lid 306 from lid feeder station 22 and presents the lid 306 to lid precisor 26. FIG. 8A illustrates a plan view of lid precisor 26, while FIG. 8B depicts a side view of lid precisor 26. Lid precisor 26 includes a vacuum chuck 110, pneumatic cylinder 112 and precisor block 114.

The bridge clip 308 (FIG. 14A) secures the die in the temporary package during testing. Bridge clips 308, which may have various configurations, provide physical connection of the tops of the temporary packages to the bases thereof. The aforementioned U.S. Pat. No. 5,367,253 to Wood et al. discloses a suitable bridge clip configuration in FIG. 1B thereof, and a more detailed description of all of the components of temporary package 300 and package carrier 180 appear hereafter. FIG. 6 illustrates a clip tray feeder which is suitable for use in the present invention. More specifically, clip tray feeder 50 preferably includes an elevator 120 which carries a stack of clip trays for presentation to the machine. Each tray is individually removed and pulled into the robot's work volume by the tray presentation arms (not shown). The clip tray feeder 50 will utilize different styles of clips by utilizing optional clip trays. The restraining device may include a clip, a clip and a lid or a clip/lid combination which are formed as a unit and used in conjunction with a die. Preferably, however, the clip is a bridge clip 308 which is picked up by the primary gripper 52 before the lid 306 or the die. The lid 306 is placed on the vacuum chuck 110, shown in FIGS. 8A and 8B. The pneumatic cylinder is actuated, pressing the precisor block 114 against the lid. This action puts the lid into a location that is "known" to robot arm system 12. It should be appreciated that the present invention is not limited to a restraining device which includes clips and lids. Any method of restraint is possible. For example, screws, adhesives or the like may be substituted for, or used in addition to, clips.

In an alternative embodiment, the restraining device need not be picked up. Rather, the restraining device may be attached to or be an integral part of the temporary package base.

After the die 202 has been picked up by the primary gripper 52, the die 202 is then presented to fine die camera 30. Fine die camera 30 is preferably located on base 42 near conveyor 36 so that it looks sideways through a prism, up at the die 202 in an arrangement similar to that of rough die camera 24. The base 42 of apparatus 10 may be constructed of metal, granite or a vibration isolation table. Base 42, however, is preferably formed of granite. A granite base provides stability, which is critical for precision and accuracy. Fine die camera 30 determines the precise location of the die 202 and takes multiple pictures of the die 202 such that the die bond pads and electrical contacts of the temporary package base can be properly aligned.

More specifically, the die 202 is secured and opposite corners of the die are presented to the fine die camera 30. The following algorithm describes the analysis done for each corner of the die. First, a binary picture of the die corner is taken. The binary picture is used for all subsequent analysis steps. Two-edge finding rulers are positioned across the width and height of the screen in order to locate the edges of the die features (Vbb ring, bond pad, etc.) specified. Once the two edges are located, line finding boxes are placed at the transition points of the edges of the die features. These are used to locate the angle of the die corner. The angles and points are used to mathematically calculate the corner point of the die etching in the field of view of the camera. The X and Y position of the corner point is the only information used from the fine die picture.

Once the die X and Y points of two opposite corners are known, two additional pictures are taken in order to precisely determine the angle of the die. The pictures are taken by placing two opposite features of the die in front of the camera. The features are on the same side of the die. Thus, by locating two points of the etching along the same side of the die, the angle of the die relative to the angle of the gripper can be calculated.

A picture is taken and the binary picture is used for all subsequent analysis steps. An edge finding ruler is utilized from the top of the vision window in the negative Y direction in order to locate the etching of the die. At the point where the etching is located, a line finding box is placed across the screen, perpendicular to the edge finding ruler in order to verify that the edge of the die has been located. This information is later used to position the die in proper alignment with the temporary package base.

While pictures are being taken by fine die camera 30, a carrier or boat 180 with temporary package bases 302 positioned therein is brought into assembly/disassembly position 28 in the direction of arrow 34 shown in FIG. 1A. The carrier is conveyed along conveyor 36 between the inlet 38 and the outlet 40, but is positioned to stop at predetermined assembly/disassembly position 28. Appropriate sensor and indexing assemblies are located at the inlet 38 and outlet 40 of conveyor 36 to control the movement of the carriers thereon.

Figure 9:
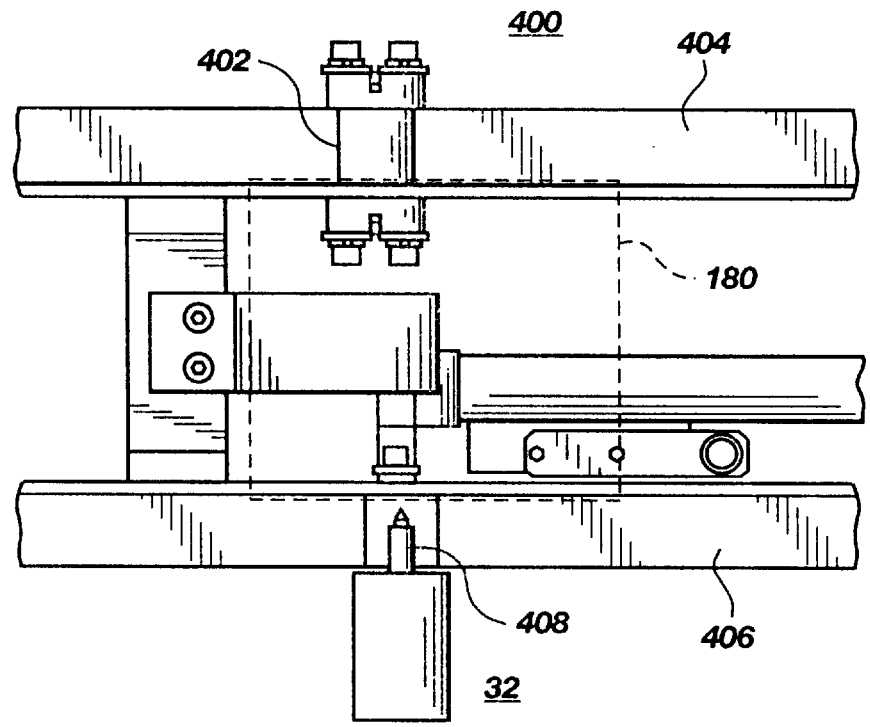
FIG. 9 is a plan view of the various components of an indexing mechanism for use in accurately positioning the boat in the assembly/disassembly station of the apparatus.

Each carrier or boat 180 (see FIGS. 16A–16C) includes a body portion 182 and a pair of side rails 184. The side rails preferably include a plurality of spaced positioning or indexing holes 186. As seen in FIG. 9, an indexing mechanism 400 includes a through-beam sensor 402 mounted on one rail 404 of conveyor 36 and a locking mechanism 32 supported on the opposite rail 406. The through-beam sensor includes an LED and phototransistor for counting the number of spaced positioning holes in the side rail of the carrier.

When a predetermined number of indexing holes 186 have been counted, locking mechanism 32 is actuated to drive a plunger 408 into one of the holes 186 to lock the carrier 180 into position. As long as the number of holes 186 and their relative spacing is known, it is thus possible to use the indexing mechanism 400 to control the selective movement of the carrier 180 through the assembly station regardless of the size of the carrier 180 or the number of packages 300 or bases 302 therein.

Each carrier 180 supports a number of temporary package bases 302 or assembled temporary packages 300, again according to whether an assembly or disassembly sequence is in order. For example, carriers containing five or ten temporary packages are suitable for use in the present invention. While the number of temporary packages in a carrier may vary and while not meant to be limiting, it has been found that four temporary packages in one carrier oriented transversely to direction 34 is a number particularly well suited for use in accordance with the present invention. Assembled temporary packages 300 are preferably placed in contact with a socket container to verify that there will be electrical contact between the die of the temporary packages 300 and burn-in boards, load boards, and the like during subsequent burn-in and other testing. While not meant to be limiting, the socket preferably raises up in position 28 to receive the leads of a package 300 and to verify electrical continuity. However, any method of insuring contact is sufficient. For example, an electrical socket 162, shown in FIG. 12B, may be plugged into each temporary package for continuity testing at the assembly/disassembly position 28 to test the die and the temporary package for electrical continuity during assembly. Each opening in the carrier for receiving a temporary base 302 is flanked by a pair of locking slots which secure restraining devices such as clips attached to the die to temporary packages in a carrier.

The present invention includes a general purpose computer control system for controlling the operation of the apparatus 10. The control system includes one or more work stations having a microprocessor having associated storage, appropriate operating system and control programs, and suitable I/O devices (such as a keyboard, mouse, display and printer). The apparatus further advantageously uses a robot arm system that is controlled by a special purpose computer control system. Although not meant to be limiting, preferably the robot is a 4-axis GANTRY robot arm, which is commercially available from Adept Technology, Incorporated, located in San Jose, Calif. The robot arm is controlled by associated control software routines that effect sequential movements of the robot arm in accordance with the processing steps.

Although not shown in detail, it should be appreciated that the various control mechanisms of the apparatus are selectively controlled by suitable actuators under the control of software programs resident in the control microprocessors. Such control mechanisms are well known in the art.

Figure 10:
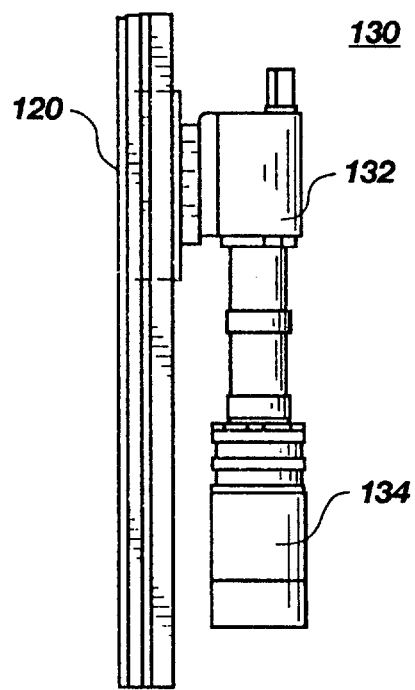
FIG. 10 shows a rough temporary package camera for use in accordance with the present invention.

The present invention further includes two temporary package cameras or DUT cameras as illustrated in FIGS. 10 and 11A. A rough temporary package picture is taken by the rough temporary package camera 130 shown in FIG. 10 to locate the temporary package 300 or package base 302 in the carrier. The rough temporary package camera 130 includes a CCD (charge coupled device) camera 132 and lens 134. The rough temporary package picture is analyzed to determine the rough location of the temporary package. While not meant to be limiting, the height of the temporary package is preferably determined by a laser height sensor, such as that manufactured by OMRON, being placed over the temporary package.

The rough temporary package or DUT camera 130 is preferably located on the Z axis of robot arm 12c and positioned to look down at the temporary package base 302 of the temporary package 300. The rough DUT camera 130 determines the temporary package base's general position in the carrier so that fine DUT camera 140 can move into correct position.

A picture is taken by camera 140 and the binary picture is used for all subsequent analysis steps. Six rulers are utilized, starting at the top of the vision window in the negative Y direction. Once the rulers are placed, the closest transition is taken to be the major line of the temporary package electrical interconnects. A line-finding box is placed perpendicular to the rulers at the transition point in order to locate the angle of the major line of electrical interconnects. From the data (IGES) file, the following parameters are known: (a) the X distance between the fiducial mark and the major line of the temporary package and (b) the side of the temporary package where the fiducial mark is located.

A transition finding ruler is placed across the package to locate the fiducial mark. A blob finding box is placed around the fiducial mark in order to precisely locate the fiducial centroid. Once the centroid is located, the center of the temporary package and the location of the electrical interconnects or contacts that the die is to be aligned with are calculated utilizing the data file information.

Using the rough temporary package picture analysis and the height sensor results, fine temporary package or DUT camera 140, as illustrated in FIG. 11A and in FIG. 11B, is positioned over the selected electrical interconnects utilizing robot arm system 12. Fine DUT camera 140 is located on the Z axis of robot arm system 12 adjacent primary gripper 52 (shown in simplified form in FIGS. 11A and 11B) and looks down towards the temporary package. Fine DUT camera 140 determines the precise location of the temporary package base 302 so that the bond pads of the die can be properly aligned with the designated contacts of the temporary package base 302. Fine DUT camera 140 preferably takes at least one picture at each end of the package base 302. In a preferred embodiment, a secondary gripper 142, such as that shown in FIGS. 11A and 11B, is also included. Secondary gripper 142 includes a vacuum quill 141, linear slide 143 and pneumatic cylinder 145 and is used to transfer dice that are presented after completion of testing in DUT's to the die pack feeders 48a–48c.

Robot arm system 12 moves the fine temporary package camera 140 over the user-specified electrical contacts of the temporary package base 302. If the temporary package base is built to specifications and the rough temporary package location process was successful, the chosen electrical contacts of the package base should be placed in the center of the field of view of fine DUT camera 140.

A picture is taken of the package base's electrical contact pattern and a copy of the picture is created. The second copy of the picture is "added" to the original picture, preferably four times. This method is termed GRAYSCALE ADDITION. This has the effect of isolating the temporary package features and "whiting out" the rest of the picture. The modified GRAYSCALE picture is then converted to a binary picture. A blob finder box is placed across the whole picture in order to locate all electrical contacts in the picture. The electrical contact closest to the center of the picture is selected and an arc-finding circle is placed around that point with the same diameter as the electrical contact pattern. This locates the center of the electrical contact pattern.

Using the fine temporary package pictures and the fine die pictures, robot arm system 12 aligns the die and temporary package base and presses the two together, thereby creating a completed assembly with the package lid and restraining device. During the assembly process, robot arm system 12 preferably drives to a minimum programmed assembly locking height and tests the completed assembly for electrical continuity. If, continuity is confirmed, robot arm system 12 then releases the restraining device or devices and die. If however, continuity is not established, the robot arm system increments to a maximum programmed force setting. If continuity is still not established, the restraining device (including lid, if separate) and die are removed from the temporary package. A new package base is then positioned and the fine die, rough temporary package, and fine temporary package pictures are retaken and the die, restraining device and new temporary package base are reassembled.

In an alternative embodiment of the invention, the assembly process includes robot arm system 12 driving until physical contact is established between the die and the temporary package base. After physical contact is established, robot arm system 12 drives to minimum programmed assembly interlocking height. The primary gripper 52 releases the lid and/or clip (restraining device) and the die and then retracts to a waiting position. Electrical continuity of the assembly is tested. If the assembly has electrical continuity between the die and the temporary package, the process is completed. If electrical continuity is not established, the primary gripper 52 retrieves the die, lid and/or restraining device components and awaits instruction from the operator. The operator then decides whether to retry the present package, utilize the next package, or purge the die from the system and use the next die.

As mentioned above, the present invention utilizes two computer memory files to determine which features on the die and package base will be located and positioned for alignment. Such an approach, using pre-stored representations of surface features of the die and package base, permits the vision system to look for, find and orient the required surface features on the actual objects to be aligned, and to subsequently execute the alignment, electric continuity test and clip attachment operation without operator intervention or other interaction. While not meant to be limiting, preferably the files are IGES files containing drawings of the face of the die and of the contact area of the package base. However, any file such as DXF or the like which is capable of CAD data transfer is suitable for use in accordance with the present invention. One file is employed for the die and the other for the temporary package base. Any CAD program is suitable for use to create the drawings, but the drawings are preferably saved in the file format.

The package base and die drawings should mirror one another, i.e. if one drawing were placed face-down on top of the other, the selected features for alignment should be superimposed.

By taking pictures of the diagonally-opposed ends of each of the dice and temporary package, and using an algorithm, a die can thus be precisely positioned within a temporary package base in a fraction of the time required by prior art techniques. For example, prior art techniques employed in DUT assembly require approximately four minutes to assemble a die in a temporary package. The present invention is capable of positioning a die in a temporary package in about 30 seconds and does so in a manner which is more precise and reliable than those techniques used in accordance with the prior art. Moreover, the methods and apparatus of the present invention provide for improved positioning of the die bond pads relative to the temporary package electrical interconnects than obtained using prior art techniques.

The present invention also includes a disassembly process for disassembling the die from the temporary package. The disassembly process is substantially the opposite of the assembly process. Dice in temporary packages 300 which have been subjected to testing enter the disassembly apparatus 13 in carriers 180 on conveyor 36 as in the assembly process. Carriers 180 are indexed through the apparatus 10 and are designed to proceed to predetermined disassembly position 28 as in the assembly process.

Referring now to FIGS. 12A–12B, an unclipping mechanism 150 is shown. Unclipping mechanism 150 is preferably positioned along conveyor 36 near predetermined assembly/disassembly position 28. As shown in FIGS. 12A–12B, unclipping mechanism 150 includes a pneumatic parallel jaw actuator 152, clip release fingers 154, a pneumatic cylinder 158 and a linear slide 160. FIG. 12A depicts the unclipping mechanism 150 in a lowered position in which the electrical test socket 162 disconnects from the temporary package. Prior to unclipping, the primary gripper 52 is placed by the robot arm system 12 into contact with the clip and/or lid and die. Clip release fingers 154 of the unclipping mechanism 150, which is raised prior to unclipping, releases the clip from the assembled package for recycling of the clip to the clip tray feeders. Mechanism 150 has, however, been superseded by a gripper-mounted actuator as subsequently described herein.

The clip, lid and die are then removed from the temporary package by primary gripper 52 and moved to disassembly inverter 44, shown in FIGS. 1A and 13. The die is placed on disassembly inverter 44, which is similar to die inverter 16. The inverted die is then reinverted such that the die is face up on disassembly precisor 46, which is similar to precisor 26 utilized in the assembly process.

The die is moved to one of the die pack feeders 48a–48c using secondary gripper 142 based on predetermined characteristics of the die. For example, dice having a certain grade or quality may be transported to station 48a for placement in a die pack 190, while dice having a designated speed grade characteristic are transported to station 48b. Station 48c is generally reserved for dice which are rejected, i.e. dice which do not meet minimum characteristics. In this manner, the dice are removed and classified according to predetermined characteristics for later assembly in component packages. Additional stations may also be included to further categorize or separate the dice based on various properties.

After the die is removed from the carrier 180 and is being subjected to inversion by disassembly precisor 46, the carrier is simultaneously indexed such that the next package in the carrier 180 is moved into predetermined assembly/disassembly position 28. In this manner, the disassembly process is continuous. After all of the dice are removed from the carrier 180, the carrier 180 continues along conveyor 36 to outlet 40, while the next carrier enters inlet 38.

It may prove beneficial to those of ordinary skill in the art to receive a more detailed description of the components of a preferred embodiment of primary gripper 52 and their respective functions, particularly in conjunction with a preferred embodiment of the temporary or test package employed with the apparatus of the present invention and manipulated by the method thereof, the preferred embodiment of package 300 being that of the aforementioned U.S. Pat. No. 5,367,253 to Wood et al.

Referring now to FIGS. 14A–14C, 15 and 16A–16C of the drawings, temporary or test package 300 generally corresponds to that depicted in FIGS. 1A–1C, 2 and 5A–5C of the '253 patent. However, reference numerals as previously employed herein are used for clarity. FIGS. 14A–14C depict a carrier 180' adapted to hold only a single package 300.

Preferred carrier 180 (see FIGS. 16A–16C) supports a plurality of die cavity plates 302, also referenced herein for simplicity as temporary package bases. Base 302 includes a cavity 310 therein and a plurality of external terminals or leads 312 extending therefrom. In an exemplary embodiment, base 302 takes the form of a ceramic DIP (dual in-line package), although other configurations, such as a QFP (quad flat pack) are certainly suitable. Carrier 180 carries a plurality, preferably four (4), of bases 302 during the sequence in which an untested die 202 is inserted into cavity 310 in alignment with base 302 for electrical communication with leads 312 for electrical testing and burn-in. As previously noted, carriers 180 include positioning holes 186 in side rails 184.

Figure 15:
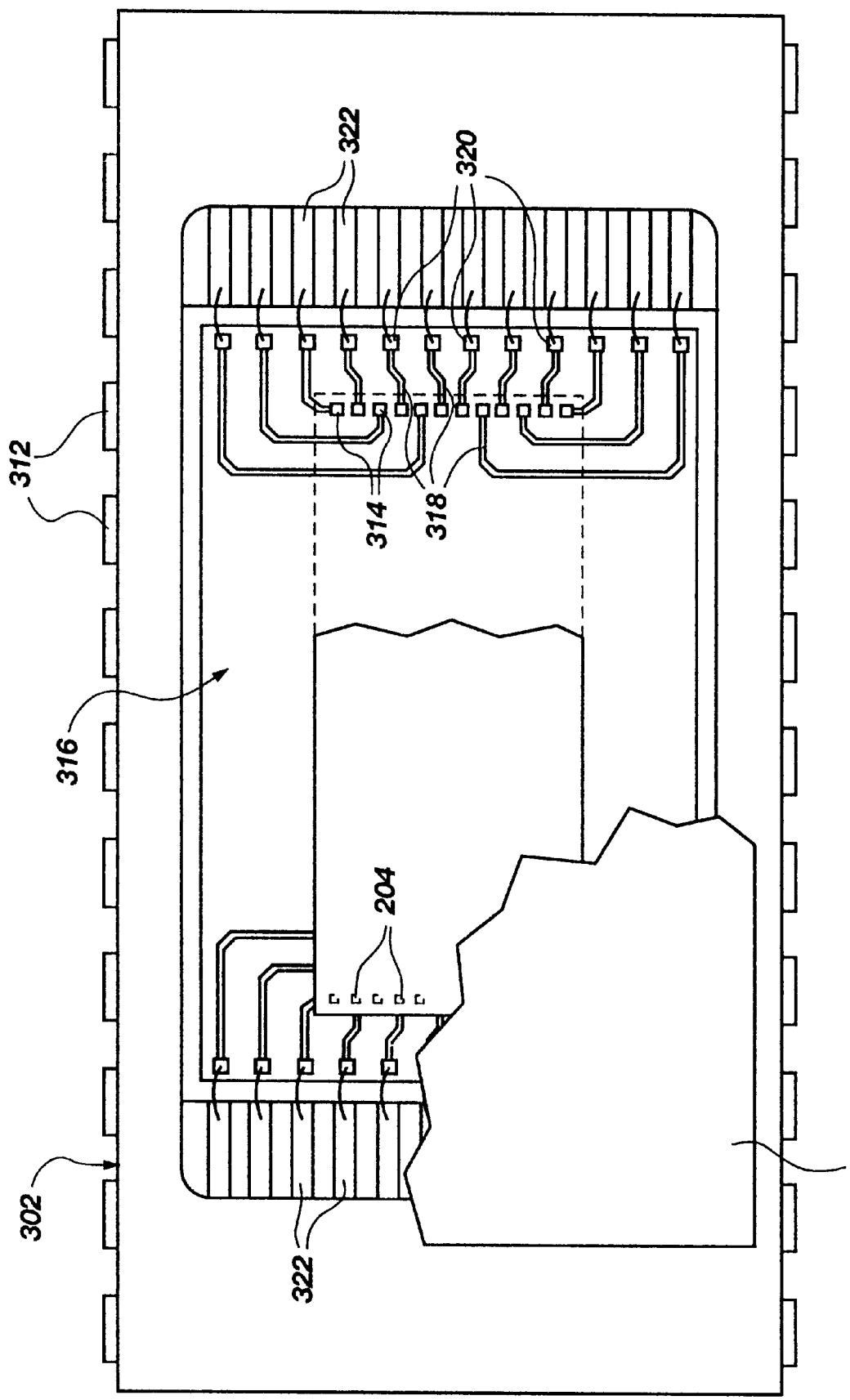
FIG. 15 is a plan view of a temporary package base with insert and die in place.

As shown in FIG. 15, bond pads 204 of die 202 are aligned with contacts 314 of ceramic die insert 316, which is mounted to base 302. Contacts 314 are located at the inner ends of conductors or circuit traces 318, the outer ends 320 of which are electrically connected by wire bonds to wirebond pads 322 on base 302, wirebond pads 322 being in electrical continuity with leads 312 extending from base 302 through internal conductors as known in the art. Insert 316, which may also be flexible or semi-rigid and of another material other than ceramic, such as polyimide, is employed to adapt packages 300 to a variety of die sizes and bond pad configurations.

Cover or lid 306 is employed superimposed over die 202 (FIG. 14B) and a bridge clamp or clip 308 employed thereover to secure die 202 between insert 316 and lid 306 with bond pads 204 aligned with contacts 314 as assembly of package 300 is completed. Bridge clip 308 is mechanically engaged with carrier 180. Clip 308 includes clip ears 344 having protruding tab catches 326, which may engage with a pair of corresponding slots 328 flanking each package base 302 on carrier 180. Leaf spring 330 presses against the top of lid 306 when catches 326 are engaged with slots 328, biasing bond pads 204 of die 202 into ohmic continuity with contacts 314 of insert 316. Clip 308 and spring 330 include aligned superimposed apertures 332 therethrough which are aligned (when lid 306 is picked up) with a smaller aperture 334 through lid 306. The purposes of these structural features will be further explained below in connection with operation of primary gripper 52 in the package assembly and disassembly sequences of the present invention.

Referring again to FIGS. 5A and 5B of the drawings, primary gripper 52 includes vacuum quill 90 supported on linear slide 92, also referred to as a quill slider base. Bridge clip vacuum cups 94, which flank vacuum quill 90, are in communication with an active vacuum system, as known in the materials-handling art. Clip arm actuator 340, including downwardly-extending clip arms 342, is also carried by primary gripper 52. Actuator 340 may comprise a Schunk parallel-jaw actuator; however, other brands and designs would also work.

Clip arms 342 are inwardly- and outwardly-movable, and are employed to bias clip ears 344 of bridge clip 308 inwardly during the package assembly and disassembly process so as to pass through slots 328 without touching the carrier 180 and potentially causing misalignment of package components and attendant damage to die 202. After bridge clip 308 is extended to its assembly position, clip ears 344 are released by arms 342 so that tab catches 326 secure clip 308 to base 302.

During the package assembly sequence, bridge clip 308 is held to the lower end of gripper 52 by vacuum cups 94 and by clip arms 342 in their inward position. The vacuum cups 94 permit pickup of the clip 308 without gripper 52 coming to a hard stop, as only cup contact is required to pull a clip from a clip tray feeder 50. Further, the use of optional clip locator pins 346, in combination with the vacuum force of cups 94, gently locates clip 308 via clip apertures 309 with respect to gripper 52 without forcing clip 308 onto gripper 52. Since the positioning system of the invention requires alignment tolerances of less than 0.001 inch, soft alignment is extremely beneficial. The vacuum cups 94 also "tell" the apparatus when a clip 308 is present or absent via a vacuum sensor communicating with the vacuum system extending to cups 94.

Vacuum quill 90, extending downward from the gripper body (and through a clip 308 when such is secured to gripper 52), is employed to hold a lid 306 and die 202 with vacuum during package assembly and disassembly operations. Quill 90 is long enough to extend below the spring of clip 308 so that the spring does not contact the lid except when the package 300 is being assembled and the spring is compressed. Linear slide 92 to which quill 90 is mounted permits vertical movement of quill 90 during placement of die 202 on and removal of die 202 from a package base 302, and may comprise any commercially available crossed roller type of linear bearing, such as a THK cross roller table. Linear slide 92 is mounted to gripper 52 in such a manner that the quill 90 may be centered with respect to a package or base, and to adjust the quill's vertical alignment so that it is perpendicular to a package or base. Such adjustments are desirable to prevent damage to a die and to the package components during assembly and disassembly operations. It should be noted that slide 92 is a passive, e.g., unmotorized component and provides the ability but not a drive for vertical quill movement.

Quill 90 (see FIG. 5C) holds both a lid 306 and a die 202 during an assembly or disassembly sequence. An inner axial vacuum channel 350 and an outer, independent annular vacuum channel 352 are provided, with coaxial but separate openings 354 and 356, respectively. Opening 356 holds lid 306 to quill 90, while opening 354 supplies a vacuum to lid aperture 334. The aperture 334 is then used to hold a die 202 to the bottom of the lid 306. Quill 90 is press fit into quill holder 360, which serves as a bracket to mount quill 90 to linear slide 92 and to provide a manifold to supply vacuum to the two vacuum channels 350 and 352. As with the clip holder vacuum system, vacuum sensors are employed with the lid and die vacuum systems to provide feedback as to whether the relevant component is present or absent from the gripper 52.

In operation, a temporary package base 302 is secured to a carrier 180. Primary gripper 52, carrying the above-referenced vacuum and actuator arm assemblies, moves to a clip tray feeder 50 and stops over a bridge clip 308. Arm 12c moves downwardly until the top surface of the clip 308 in question is contacted by clip vacuum cups 94. Vacuum is then applied to firmly attach clip 308 to cups 94. At the same time, the vacuum cups bellows collapse upwardly, shortening the vertical length of the cups 94 and pulling the clip 308 up out of the clip tray and onto the clip locator pins 346 to align clip 308 with respect to gripper 52.

The clip arms 342 of actuator 340 then move inwardly, in turn moving clip ears 344 inwardly to permit ears 344 to move through slots 328 on carrier 180 as the clip 308 is secured over package base 302.

Arm 12c then moves over lid feeder station 22 and lowers gripper 52 until the lowermost part of quill 90 touches the top of a lid 306. Vacuum is then supplied to outer channel 352 and opening 356 to hold the lid 306 to the quill 90. Arm 12c, with attached clip 308 and lid 306, then moves gripper 52 over a bare, face-down die 202 which has been removed from a wafer 200 and then inverted, or provided from a gel pack 190. Vacuum is supplied to inner channel 350 and opening 354 of quill 90 to hold die 202 to the bottom of lid 306 through aperture 334.

Gripper 52 is moved upward and positioned over fine die camera 30 for location of specified features on the active or circuitry side of die 202, such as the length, width and angular orientation (with respect to the Z-axis) of the die 202 and the pattern and location of bond pads 204 and other circuit elements of the die. The die 202 is then aligned with a package base 302 carried by a carrier 180 using vision techniques including a pattern recognition system as previously discussed.

After die to package base alignment, the gripper 52 is moved down until the die bond pads 204 make physical contact with the electrical contacts 314 of package insert 316. Gripper 52 moves further downward to extend the tabs of clip ears 344 into slots of carrier 180 for clip retention to package base 302. As the apparatus moves downward, linear slide 92 is forced relatively upward and maintains a biasing force against lid 306 and die 202, which holds the die 202 firmly in place against the package insert contacts 314. The quill biasing force is necessary to ensure non-movement of die 202 while leaf spring 330 of clip 308 contacts the top surface of lid 306 prior to the engagement of clip ears 344 with carrier 180.

The last assembly sequence step is outward movement of clip ears 344 to engage with the package 300 and the carrier 180. As robot arm 12c reaches its lowest vertical position, actuator 340 moves arms 342 outwardly to permit the tab catchers 326 of ears 344 to engage with the slots of carrier 180. Substantially simultaneously, the vacuum to cups 94 and quill 90 is terminated. Arm 12c then moves gripper 52 upward to repeat the cycle. The bridge clip 308 is thus secured over the package base 302, sandwiching the lid 306 and die 202 between the spring 330 of the clip 308 and the insert 316 carrying the contacts 314 of the package base 302.

As shown in FIGS. 16B and 16C, after a carrier 180 is filled with DUT's, a protective cover 370 is optionally placed over support columns 372 and secured in place by pin 374.

It should be noted that what is currently preferred and understood by the inventors to be the best mode of practicing the invention employs a carrier structure disclosed and claimed in U.S. Pat. No. 5,519,332. The '332 patent employs a base which is engaged by a bridge clip, rather than the package carrier being so engaged. However, the engagement mechanism (slots receiving tabbed arms of the bridge clip) is the same as disclosed herein. Thus, the description of the assembly and disassembly sequences set forth herein are equally applicable to the carrier structure of the '332 patent, and no further description thereof is required.

Disassembly of a package 300 follows the same procedures described above, except obviously in reverse, wherein arm 12c commences disassembly by extending gripper 52 over a package 300. Actuator arms 342 inwardly compress clip ears 344 and gripper 52 pulls die 202, lid 306 and clip 308 upward away from package base 302 and carrier 180 using vacuum for the die 202 and lid 306 and vacuum and actuator arms 342 to hold clip 308. Tested die 202, lid 306 and clip 308 are then placed as desired in suitable receptacles at predetermined locations for further handling.

The foregoing system is adapted for handling and KGD qualification of a wide variety of dice. For example, dice from 0.100×0.200 inch up to 1.0×1.0 inch, with thickness ranging from 0.010 to 0.030 inch, may be accommodated. Dice to insert placement, as measured from geometric center of the die bond pad 204 to the geometric center of the insert contact 314, is within 18 microns, including total system variations due to accuracy and repeatability, with die and insert input data (IGES file) located to plus or minus 0.5 micron. Lot tracking of all materials employed, including wafers and DUT's, is effectuated by bar coding. Units per hour throughput, referenced above as about 120 per hour (one die-to-package assembly per 30 seconds), will ultimately exceed 300 per hour.

It should be appreciated by those skilled in the art that the specific embodiments disclosed above may be readily utilized as a basis for modifying or designing other structures for carrying out the same purposes of the present invention. For example, other known uses for this type of technology include, but are not limited to, flip chip die bonding, chip on board bonding, any high accuracy die attach process, and known good die assembly utilizing any temporary carrier technology. Additionally, it is within the scope of the invention to assemble the die in the package such that testing is done with the die being in an upright position rather than in an inverted position. The die may then be inverted during disassembly or alternatively remain in an upright position. It should also be realized by those skilled in the art that such equivalent constructions do not depart from the spirit and scope of the invention as set forth in the appended claims.

What is claimed is:

1. A method of positioning a semiconductor die within a test package including first and second sections, comprising the steps of:

developing a representation corresponding to at least one exterior portion of said die;

associating said representation corresponding to said at least one exterior portion of said die with a representation of at least one exterior portion of one of said test package sections;

utilizing said associated representations to define movement of a transport assembly, and moving said die and said test package sections into desired, mutually cooperative orientations; and securing said first and second sections of said test package together with said die while maintaining said die in said mutually cooperative orientations with respect to at least one of said test package sections.

2. The method of claim 1, wherein said representation of said at least one exterior portion of said die is a camera-generated image.

3. The method of claim 1, wherein said representation of said at least one exterior portion of one of said test package sections is a camera-generated image.

4. The method of claim 1, wherein said representation of said at least one exterior portion of one of said test package sections is a graphic image.

5. The method of claim 4, wherein said representation of said at least one exterior portion of one of said test package sections is a computer aided design-generated image.

6. The method of claim 1, further comprising securing said die between said first and second test package sections.

7. The method of claim 6, further comprising securing said die in electrical communication with one of said first and second test package sections.

* * * * *

UNITED STATES PATENT AND TRADEMARK OFFICE
CERTIFICATE OF CORRECTION

PATENT NO : 5,955,877
DATED : September 21, 1999
INVENTOR(S) : Farnworth et al.

It is certified that error appears in the above-identified patent and that said Letters Patent are hereby corrected as shown below:

On the Title Page:

On page 1 of the title page, in "Other Publications", line 9, change "*Intenational*" to --*International*--; and On page 2 in "U.S. Patent Documents", line 5, change "10/1991" to --11/1991--.

In the Drawings:

In Fig. 16C, change reference numeral "372" located at upper right to --370--.

In the Specification:

Column 2, line 52, after "is" insert --,-- and after "therefore" insert --,--;

Column 4, line 41, after "packages" insert --,-- and after "respectively" insert --,--;

Column 8, line 26, change after "predetermined" insert --assembly/disassembly--;

Column 9, line 15, change "workcell" to --work cell--;

Column 9, line 45, change "base" to --support surface--;

UNITED STATES PATENT AND TRADEMARK OFFICE
CERTIFICATE OF CORRECTION

PATENT NO : 5,955,877
DATED : September 21, 1999
INVENTOR(S) : Farnworth et al.

It is certified that error appears in the above-identified patent and that said Letters Patent are hereby corrected as shown below:

Column 11, line 16, change "base" to --support surface--;

Column 11, line 20, change "Base" to --Support surface--;

Column 12, line 38, change "insuring" to --ensuring--;

Column 14, line 19, after "If" delete ",";

Column 14, line 21, after "If" insert --,--;

Column 15, line 19, delete "13"; and

Column 15, line 54, after "i.e." insert --,--.

Signed and Sealed this

Tenth Day of April, 2001

Attest:

NICHOLAS P. GODICI

*Attesting Officer*   *Acting Director of the United States Patent and Trademark Office*